(12) United States Patent
Tsai et al.

(10) Patent No.: US 8,285,061 B2
(45) Date of Patent: Oct. 9, 2012

(54) APPARATUS FOR IMAGE PROCESSING WITH ENCODING SELECTION

(75) Inventors: Tsung-Han Tsai, Zhongli (TW); Yu-Hsuan Lee, Yonghe (TW); Yu-Yu Lee, Kaohsiung (TW)

(73) Assignee: National Central University, Taoyuan County (TW)

( * ) Notice: Subject to any disclaimer, the term of this patent is extended or adjusted under 35 U.S.C. 154(b) by 496 days.

(21) Appl. No.: 12/591,850

(22) Filed: Dec. 3, 2009

(65) Prior Publication Data
US 2010/0232720 A1  Sep. 16, 2010

(30) Foreign Application Priority Data
Mar. 10, 2009 (TW) .............................. 98107714 A

(51) Int. Cl.
*G06K 9/36* (2006.01)
(52) U.S. Cl. ...................................................... 382/237
(58) Field of Classification Search .................. 382/162, 382/166, 232–233, 237, 239, 244–250; 341/51; 348/394.1–395.1, 403.1, 408.1, 413.1, 421.1; 375/240.12, 240.18–240.2
See application file for complete search history.

(56) References Cited

U.S. PATENT DOCUMENTS

| | | | |
|---|---|---|---|
| 6,628,836 B1 * | 9/2003 | Wittenbrink et al. | 382/232 |
| 6,650,784 B2 * | 11/2003 | Thyagarajan | 382/244 |
| 6,785,425 B1 * | 8/2004 | Feder et al. | 382/247 |
| 6,898,313 B2 * | 5/2005 | Li et al. | 382/176 |
| 7,689,051 B2 * | 3/2010 | Mukerjee | 382/244 |
| 7,751,475 B1 * | 7/2010 | Crandall et al. | 375/240.03 |
| 8,031,937 B2 * | 10/2011 | Rasmusson et al. | 382/166 |

* cited by examiner

*Primary Examiner* — Jose Couso
(74) *Attorney, Agent, or Firm* — Rosenberg, Klein & Lee

(57) ABSTRACT

The present invention provides an apparatus and a method for image processing. The apparatus for image processing comprises an encoding circuit, which can select two reference pixels according to two reference pixels and produce a maximum pixel value and a minimum pixel value according the two reference pixels. The present invention further comprises a color-difference operational unit for selecting a plurality of color pixels as a basic pixel, a first color pixel, and a second color pixel. When encoding the basic pixel, a first color difference, and a second color difference, respectively, first encoding data corresponding to the basic pixel, second encoding data corresponding to the first color difference, and third encoding data corresponding to the second color difference are produced, respectively.

12 Claims, 22 Drawing Sheets

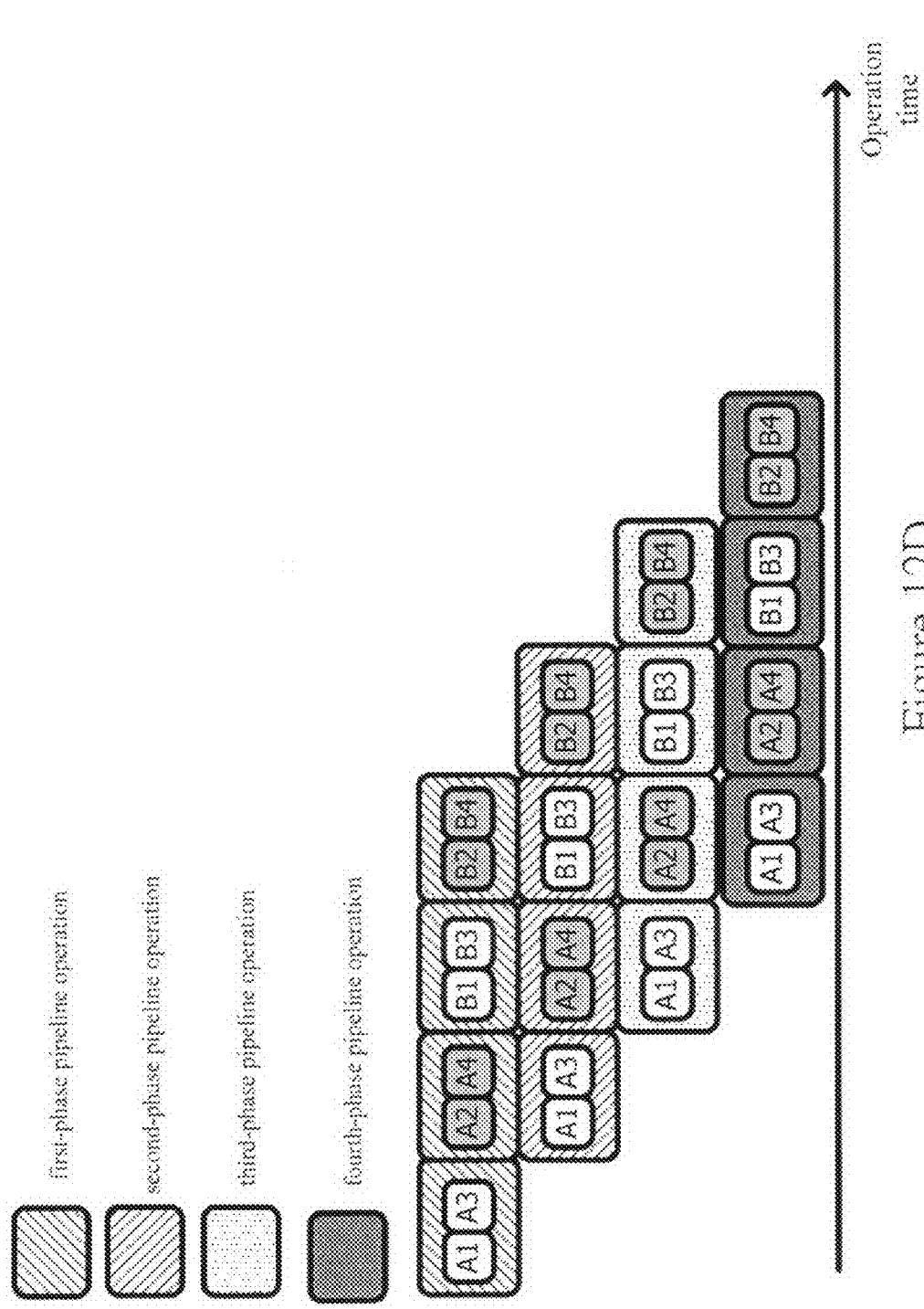

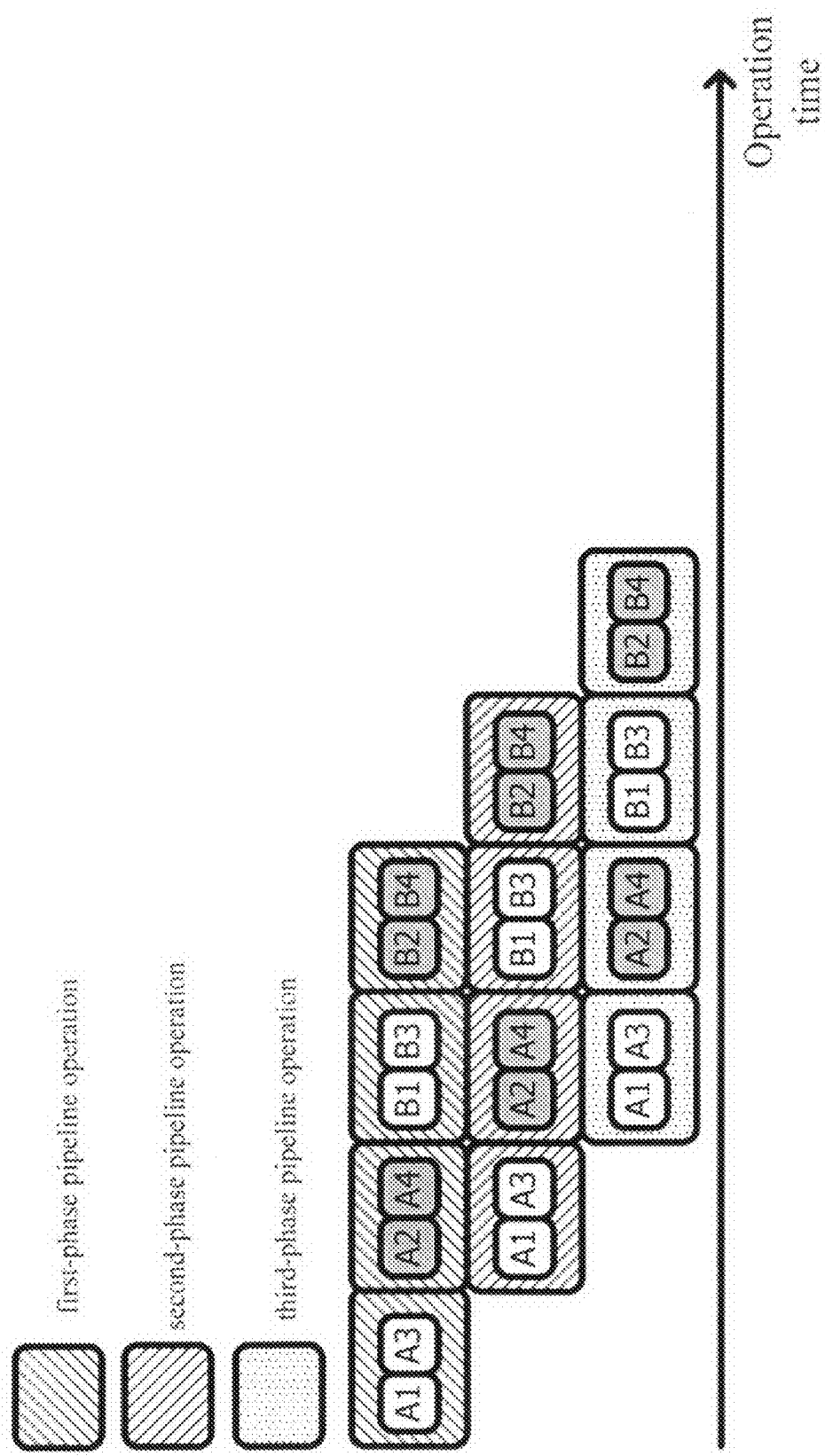

APPARATUS FOR IMAGE PROCESSING WITH ENCODING SELECTION

FIELD OF THE INVENTION

The present invention relates to an apparatus for image processing.

BACKGROUND OF THE INVENTION

With rapid progresses in display technologies, high-definition display apparatus has become the mainstream in the market, and high-speed digital transmission interfaces, for example, High Definition Multimedia Interface (HDMI), are established accordingly. High-speed digital transmission interfaces can effectively reduce the demand of memory in high-definition display apparatuses without strict requirements in processing speed of display chips. For improving the display processing efficiency, the processing speed of display chips can be achieved by using novel semiconductor technologies. However, the bandwidth of the memories used in the display chips is still the technical bottleneck. In a multi-chip system, the power consumption of accessing DRAM in a videophone system occupies 60% of the total power consumption. Thereby, embedded-DRAM or embedded-SRAM technologies are used to reduce the power consumption of accessing frame buffers. Nevertheless, the production yield of chips affects severely the capacity of built-in storage. If the built-in storage capacity is increased for high-end display specifications, the problem of production yield will occur, which will result in an increase in overall cost. Besides, the problems of power consumption and bandwidth described above still cannot be solved.

For solving the problems described above, embedded encoding/decoding units are set in modern video apparatus for reducing the requirement in memory bandwidth and the input/output power of frame buffers. FIG. 1 shows a block diagram of an image display chip according to the prior art. As shown in the figure, the image display chip 10 comprises a first encoding/decoding unit 12, a second encoding/decoding unit 14, a third encoding/decoding unit 16, a fourth encoding/decoding unit 18, an HDMI unit 20, an image hardware processing unit 22, a sequential progressive scan unit 24, and a timing controller for liquid crystal display (LCD) 26. The first encoding/decoding unit 12, the second encoding/decoding unit 14, the third encoding/decoding unit 16, and the fourth encoding/decoding unit 18 are embedded encoding/decoding units. The first encoding/decoding unit 12 is coupled to the HDMI unit 20; the second encoding/decoding unit 14 is coupled to the image hardware processing unit 22; the third encoding/decoding unit 16 is coupled to the sequential progressive scan unit 24; and the fourth encoding/decoding unit 18 is coupled to the timing controller for LCD 26. In addition, the first encoding/decoding unit 12, the second encoding/decoding unit 14, the third encoding/decoding unit 16, and the fourth encoding/decoding unit 18 are coupled in parallel with a system bus 102, which is further coupled to an external memory 104. The HDMI unit 20 is further coupled to a transmission line 11. The timing controller for LCD 26 is further coupled to an LCD 30.

The image display chip 10 according to the prior art receives a video signal transmitted by the transmission line 11 via the HDMI unit 20, and the video signal is compressed by the first encoding/decoding unit 12 and is registered in the external memory 104. Alternatively, an image signal is read by the image hardware processing unit 22, and the image signal is compressed by the second encoding/decoding unit 14 and is registered in the external memory 104. Or, a scan signal is given by scanning a frame by the sequential progressive scan unit 24, and the scan signal is encoded by the third encoding/decoding unit 16 and is registered in the external memory 104. Then, the video signal, the image signal, or the scan signal registered in the external memory 104 is read by the fourth encoding/decoding unit 18 via the system bus 102, and is transmitted to the timing controller for LCD 26. The timing controller for LCD 26 is driven to control the LCD for displaying according to the video signal, the image signal, or the scan signal. In the image display chip 10 according to the prior art, the transmission rate of the embedded encoding/decoding unit has to be as high as possible for display applications, especially for displaying high-definition images. The image display chip 10 according to the prior art also should be compatible to other displaying modes. The gate count of the embedded encoding/decoding unit is usually simplified for reducing the cost and hence reducing the price of the image display chip, so that the price is acceptable to the public. Besides, the encoding efficiency of a general embedded encoding/decoding unit can provide a preferable compression ratio. Thereby, the embedded encoding/decoding unit includes the functions of high transmission rate, compact gate count, and preferable encoding efficiency.

Many complicated lossless compression method, such as JPEG-LS and CALIC, adopt numerous sophisticated algorithms for improving encoding efficiency. However, the complexity and dependency of data series of those algorithms limit the possibility of development in embedded encoding/decoding units. In a complex algorithm, fast, efficient, and a lossless image compression system is suitable for the algorithm of embedded encoding/decoding units with preferable encoding efficiency. Nevertheless, the problem caused by data dependency still exists. For example, the amount of data for encoding/decoding is increased when the next pixel is processed according to the encoding/decoding parameters produced during the encoding/decoding process for the previous pixels. Besides, the problem of data dependency limits the compatibility when image processing is applied to high transmission rate.

Accordingly, the present invention provides an apparatus for image processing for providing preferable encoding efficiency and transmission efficiency to solve the problems described above.

SUMMARY

An objective of the present invention is to provide an apparatus for image processing, which use color pixels to give color differences for reducing the amount of data in encoding operations.

Another objective of the present invention is to provide an apparatus for image processing, which use fixed divisor parameters for preventing reduced efficiency in encoding operations caused by data dependency.

The present invention provides an apparatus for image processing, which comprises an encoding storage unit, an encoding access processing unit, an encoding operational unit, a compact adjusted binary encoder, and a Golomb-Rice encoder. The encoding access process unit receives one or more color pixels and stores to the encoding storage unit. An encoding module is coupled to the encoding access processing unit, which reads the color pixel stored in the encoding storage unit and inputs to the encoding module. The encoding module produces a corresponding encoding parameter according to the color pixel. The encoding module also selects an encoding method for encoding according to the color pixel and the encoding parameter. The encoding module outputs encoded data corresponding to the color pixel. An encoding control unit is coupled to the encoding access process unit and the encoding module, and controls the encoding access processing unit to access the color pixel. In addition, the encoding control unit also controls the encoding module to encode the color pixel. If the color pixel has two reference pixels, the encoding module selects an encoding method corresponding to the color pixel according to the two reference pixels and performs encoding. If the color pixel has no reference pixel, the encoding module will not encode the color pixel.

BRIEF DESCRIPTION OF THE DRAWINGS

FIG. 12D shows a schematic diagram of encoding operations according to a preferred embodiment of the present invention;

FIG. 18C shows a schematic diagram of decoding operations according to a preferred embodiment of the present invention.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
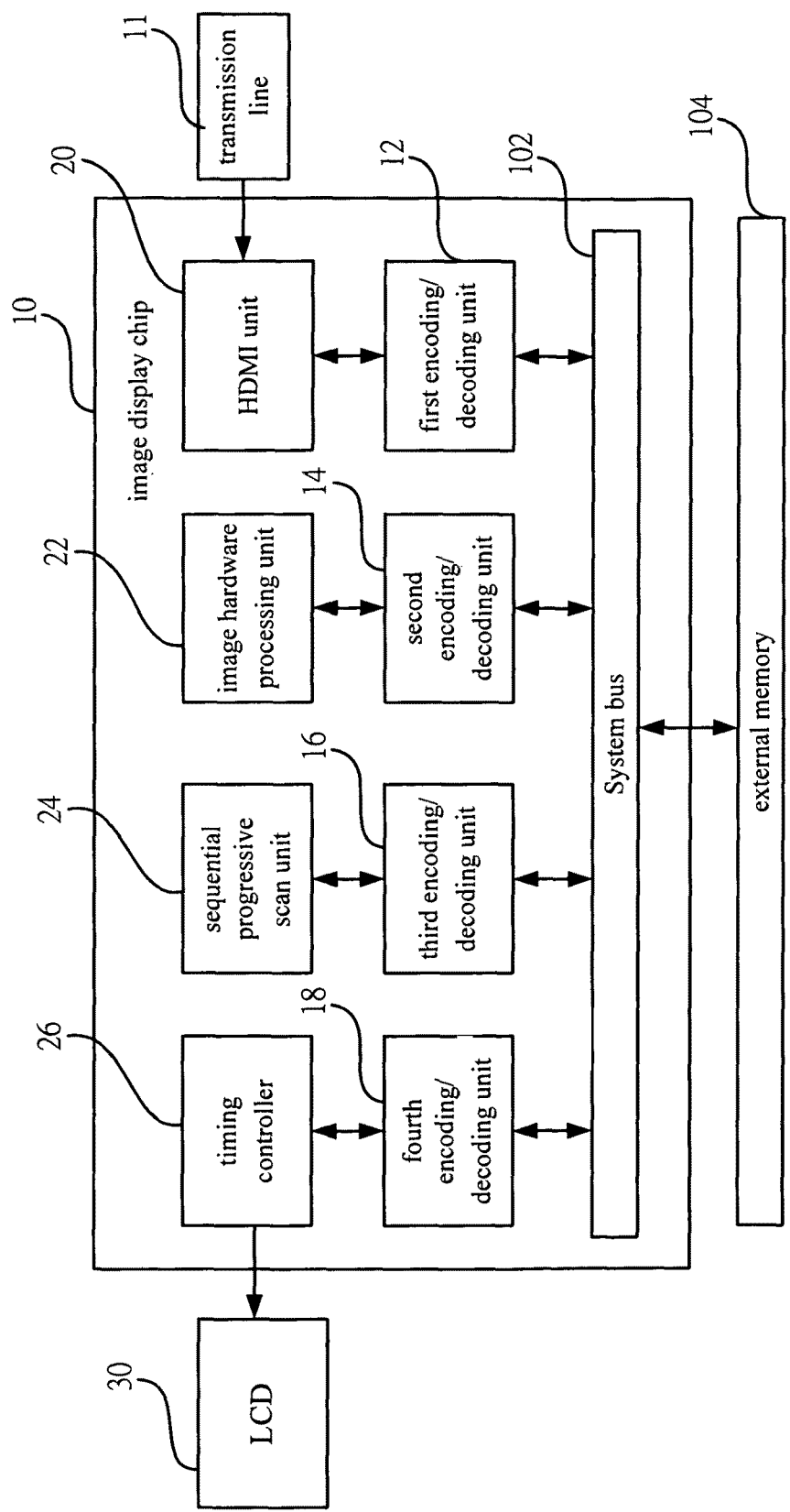
FIG. 1 shows a block diagram of an image display chip according to the prior art.
Figure 2:
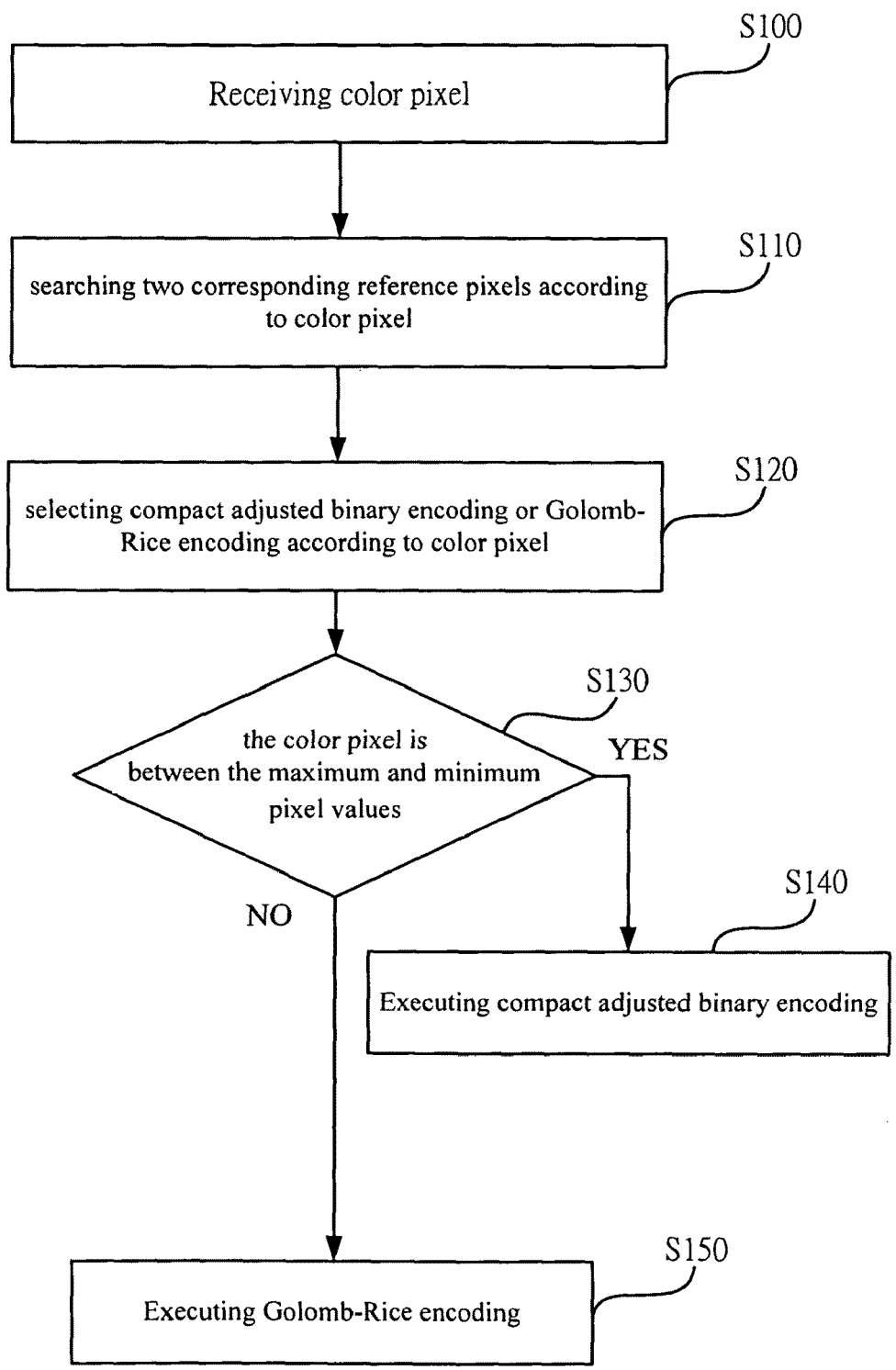
FIG. 2 shows a flowchart of image encoding according an embodiment of the present invention.

FIG. 2 shows a flowchart of image encoding according an embodiment of the present invention. As shown in the figure, the method for image processing according to the present invention comprises the following steps. First, the step S100 is executed for receiving a color pixel. Then the step S110 is executed for searching two corresponding reference pixels according to the color pixel. Next, the step S120 is executed for computing a maximum pixel value and a minimum pixel value corresponding to the color pixel according to the two reference pixels. Afterwards, the step S130 is executed for selecting the compact adjusted binary encoding or the Golomb-Rice encoding according to the color pixel, the maximum pixel value, and the minimum pixel value. When the compact adjusted binary encoding is selected, the step S140 is executed for producing encoding data corresponding to the color pixel; when the Golomb-Rice encoding is selected, the step S150 is executed for producing encoding data corresponding to the color pixel.

Figure 3A:
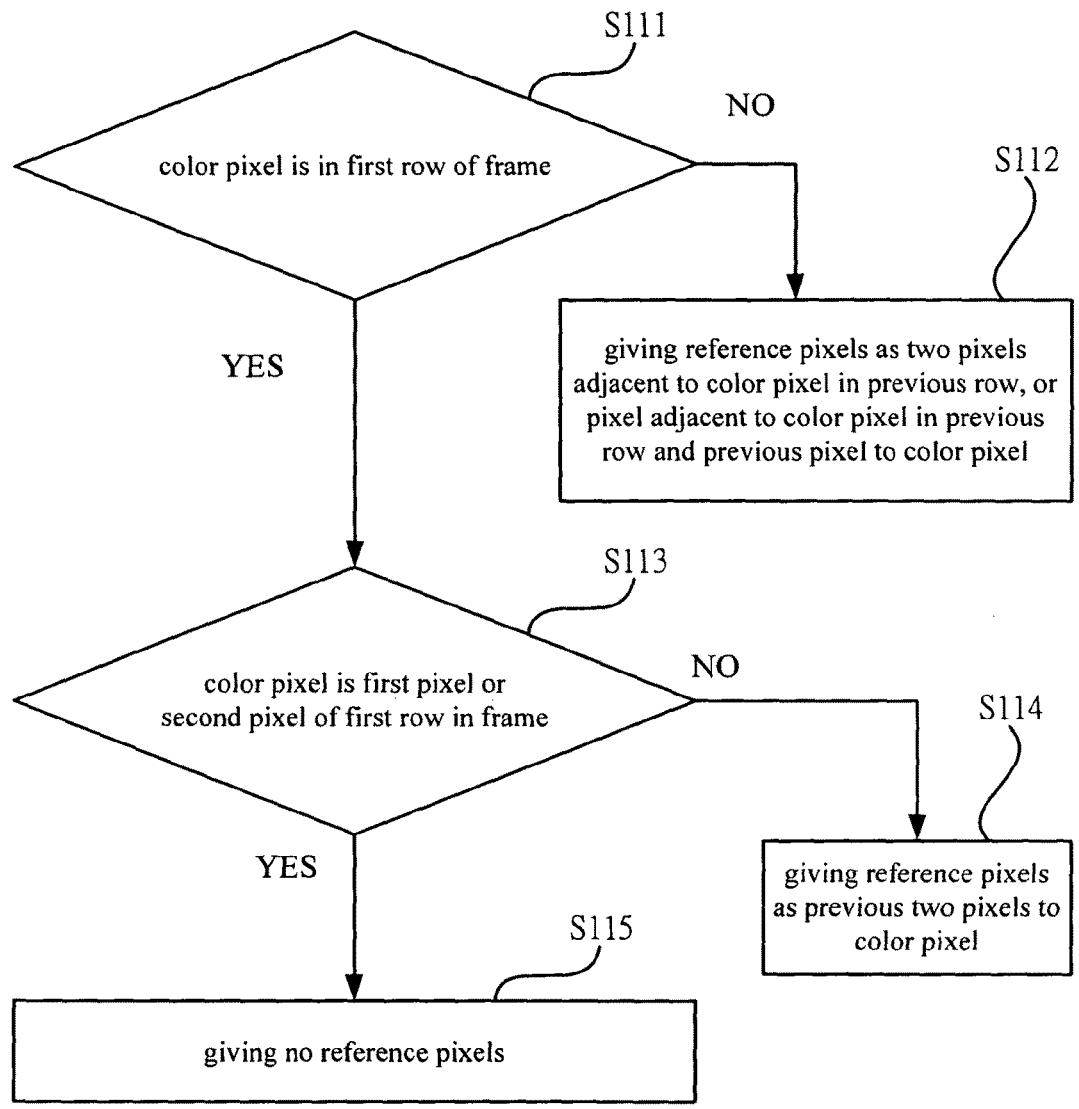
FIG. 3A shows a flowchart of searching reference pixels according to an embodiment of the present invention.

In the step S110, as shown in FIG. 3A, the following steps are executed for judging the reference pixels. First, the step S111 is executed for judging if the color pixel is in the first row of a frame. When the color pixel is not in the first row of a frame, the step S112 is executed for giving the reference pixels as the two pixels adjacent to the color pixel in the previous row, or as the pixel adjacent to the color pixel in the previous row and the previous pixel to the color pixel. When the color pixel is in the first row of a frame, the step S113 is executed for judging if the color pixel is the first pixel or the second pixel of the first row in the frame. When the color pixel is not the first pixel or the second pixel of the first row in the frame, the step S114 is executed for giving the reference pixels as the previous two pixels to the color pixel. When the color pixel is the first pixel or the second pixel of the first row in the frame, the step S115 is executed for giving no reference pixels for the color pixel.

Figure 3B:
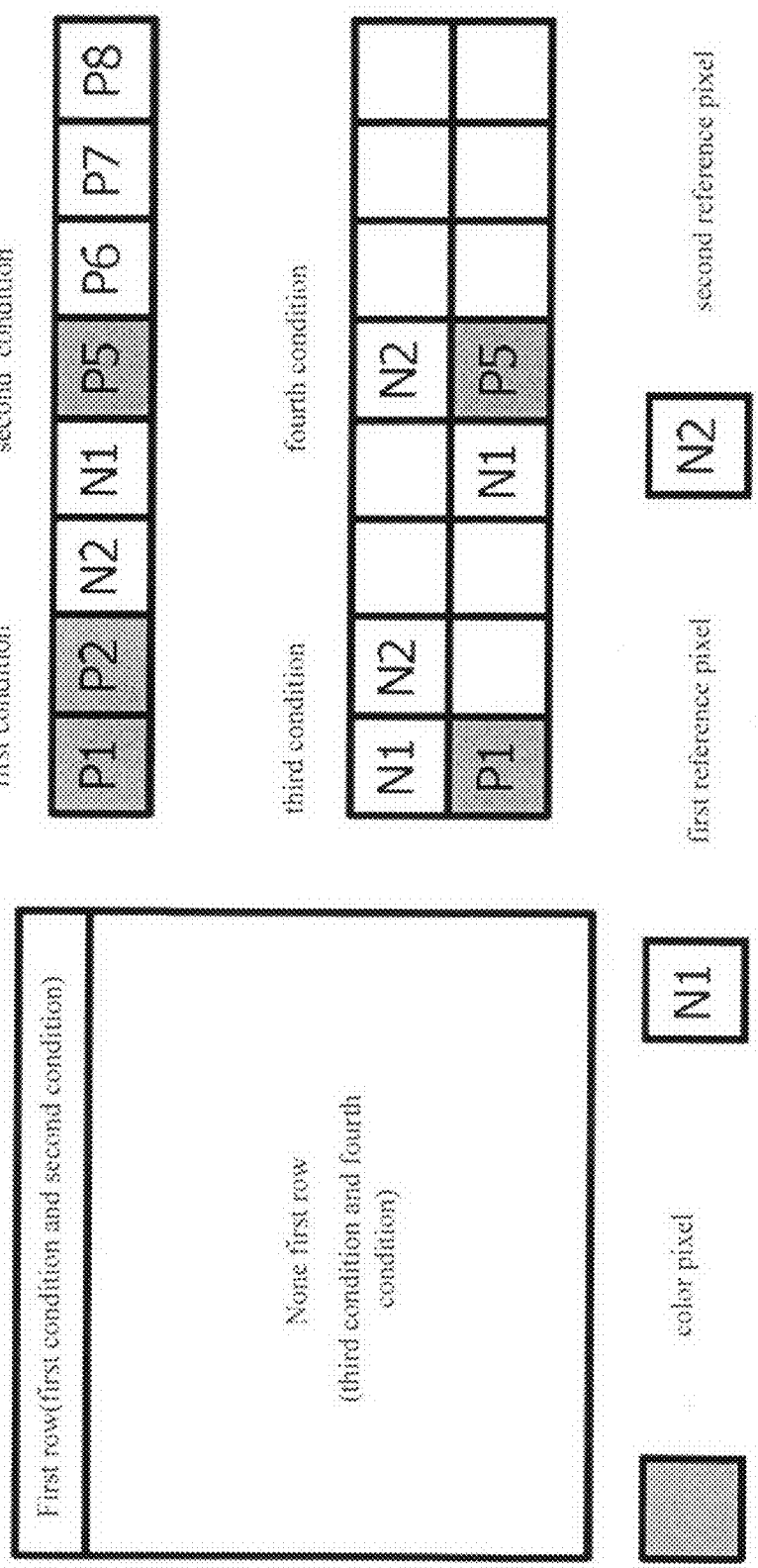
FIG. 3B shows a schematic diagram of searching reference pixels according to an embodiment of the present invention.

In the step S111, if the judgment is no, then the step S112 is executed; if yes, the step S113 is executed. In the step S112, the color pixel is judged not to be a color pixel in the first row of a frame. Thereby, the reference pixels corresponding to the color pixel are the two pixels adjacent to the color pixel in the previous row, or the pixel adjacent to the color pixel in the previous row and the previous pixel to the color pixel. In the step S113, if the judgment is no, then, as shown in the step S114, the reference pixels corresponding to the color pixel are the previous two pixels to the color pixel; if yes, as shown in the step S115, the color pixel has no reference pixel, and encoding will not be performed on the color pixel. As shown in FIG. 3B, when the color pixel has no reference pixel as the first condition according to the present embodiment, the color pixel is the first or second pixel in the first row of a frame, and encoding will not be performed on the color pixel. When the two reference pixels are the previous two pixels to the color pixel, this is the second condition according to the present embodiment. When the two reference pixels of the color pixel are the two pixels adjacent to the color pixel in the previous row, this is the third condition according to the present embodiment. When the two reference pixels of the color pixel are the pixel adjacent to the color pixel in the previous row and the previous pixel to the color pixel, this is the fourth condition according to the present embodiment. According to the present embodiment, reference pixels exist in the second, third, and fourth conditions.

In the step S120, the maximum pixel value and the minimum pixel value according to the two reference pixels of the color pixel are given. Thereby, the maximum and minimum pixel values are the pixel values of the two reference pixels. In the step S130, judge if the color pixel is between the maximum and minimum pixel values. When the color pixel is between the maximum and minimum pixel values, the step S140 is executed for selecting the compact adjusted binary encoding, encoding the color pixel, and producing encoding data corresponding to the color pixel. When the color pixel is not between the maximum and minimum pixel values, the step S150 is executed for selecting the Golomb-Rice encoding, encoding the color pixel, and producing encoding data corresponding to the color pixel. When the Golomb-Rice encoding is selected for encoding the color pixel, a fixed encoding parameter, which is a divisor parameter with a preferable value of the square of 2, namely, 4, is used.

Figures 4A, 4B:
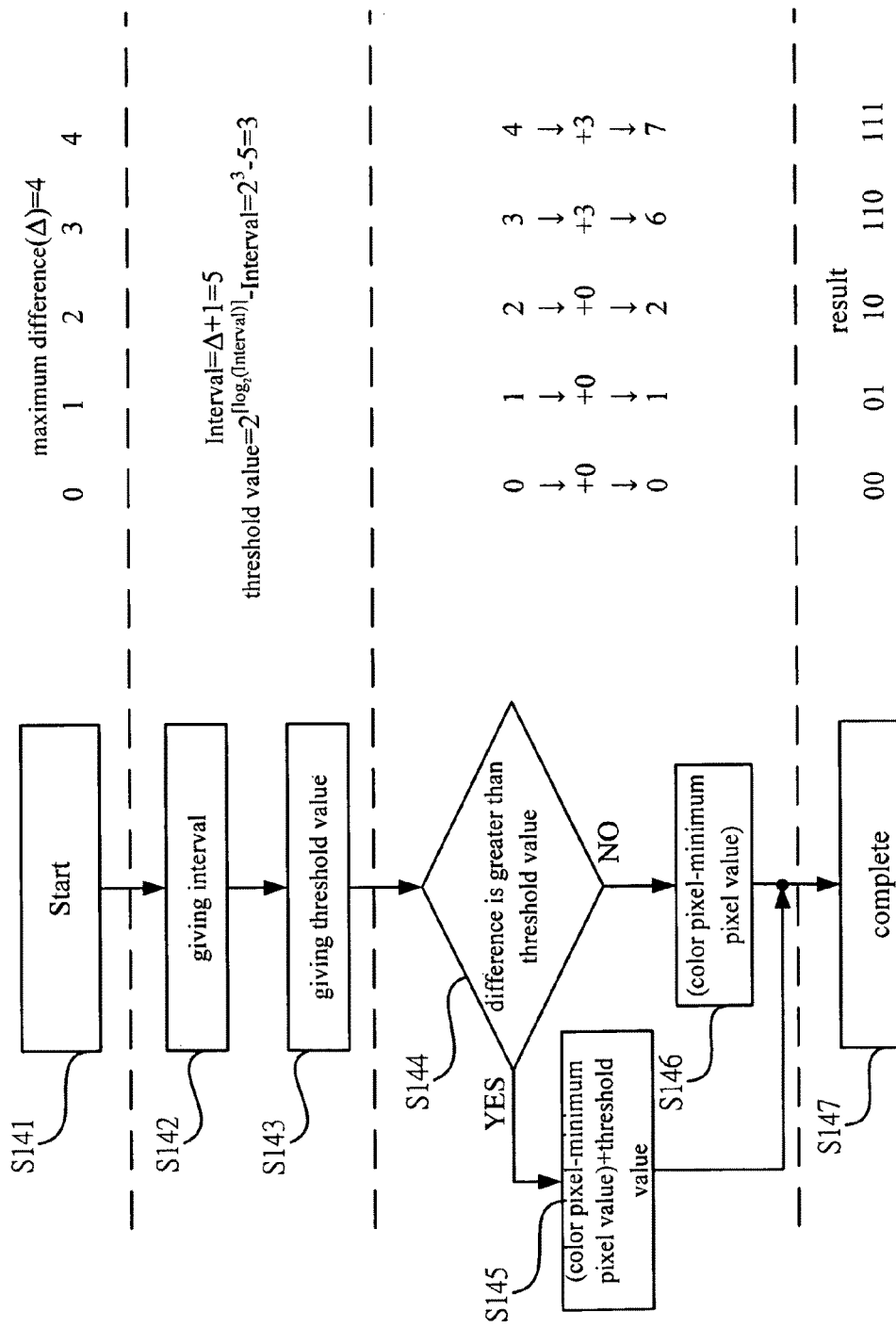
FIG. 4A shows a flowchart of the compact adjusted binary encoding according to an embodiment of the present invention.
FIG. 4B shows a schematic diagram of the compact adjusted binary encoding according to an embodiment of the present invention.

FIG. 4A and FIG. 4B show a flowchart and a schematic diagram of the compact adjusted binary encoding according to an embodiment of the present invention. As shown in FIG. 4A, the compact adjusted binary encoding first executes the step S141 for subtracting the minimum pixel value from the color pixel and producing a difference. Then, the step S142 is executed for giving an interval by subtracting the minimum pixel value from the maximum pixel value plus one. Next, the step S143 is executed for calculating the base 2 logarithm of the interval to give a threshold value. Afterwards, the step S144 is executed for producing a comparison result by comparing the threshold value and the difference. When the difference is greater than the threshold value, the step S145 is executed; when the difference is smaller than the threshold value, the step S146 is executed. Thereby, the corresponding encoding can be performed. Finally, the step S145 is executed for completing the encoding. In the step S145, the encoding format is (color pixel-minimum pixel value)+threshold value; in the step S146, the encoding format is (color pixel-minimum pixel value).

As shown in FIG. 4B, according to the present embodiment, the difference is between the maximum and minimum pixel values; subtracting the minimum pixel value from the maximum pixel value gives the maximum difference of 4; and the interval is the maximum difference plus 1. The base 2 logarithm of the interval described above is 3, and thereby the threshold value is the cube of 2 minus the interval, that is, 8 minus 5 leaves 3. Hence, when the difference is 0 to 2, the encoding format is (color-minimum pixel value). The color pixels greater than or equal to 3 is added by the threshold value for encoding.

Figure 5:
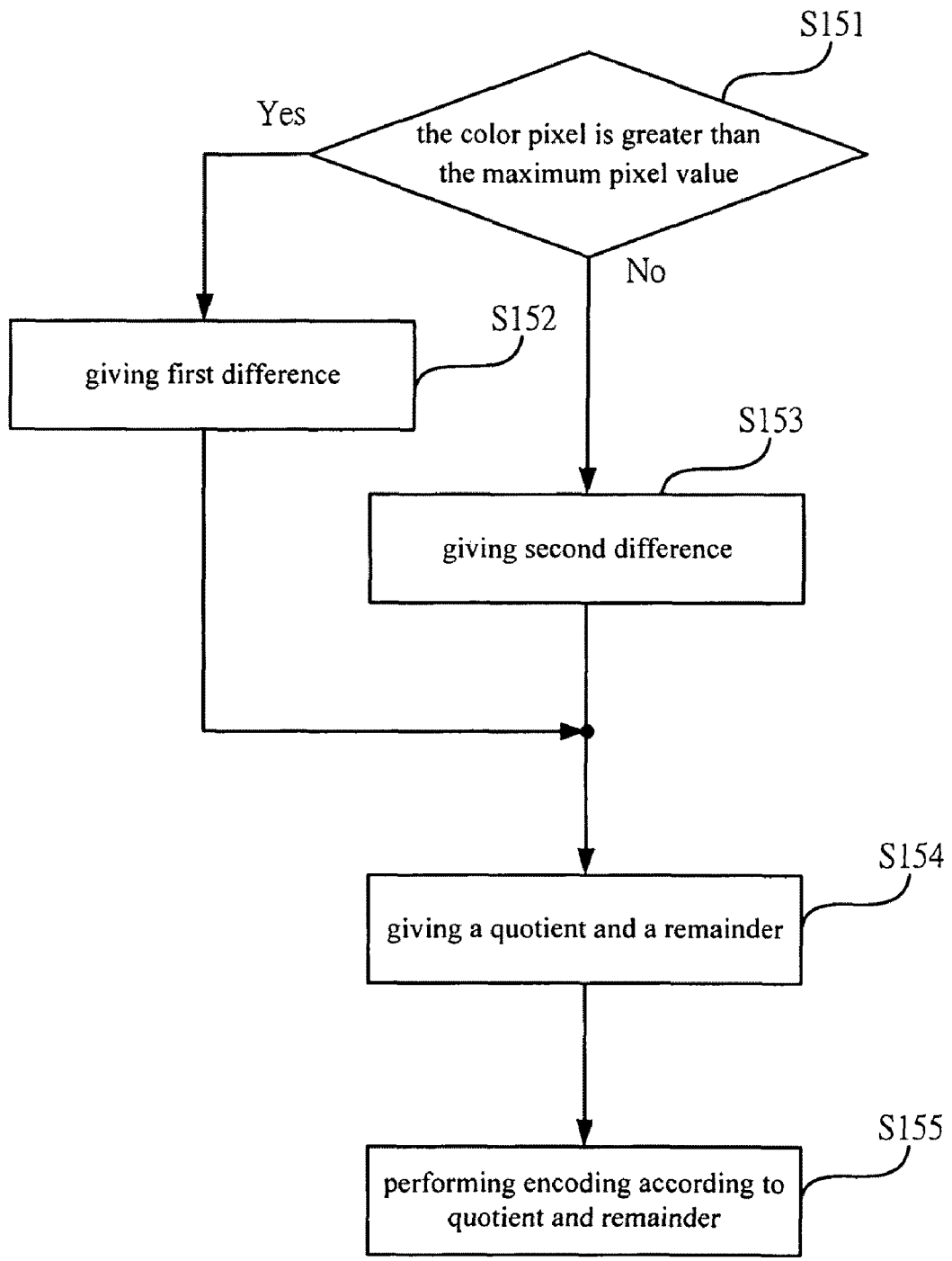
FIG. 5 shows a flowchart of the Golomb-Rice encoding according to an embodiment of the present invention.

FIG. 5 shows a flowchart of the Golomb-Rice encoding according to an embodiment of the present invention. As shown in the figure, the Golomb-Rice encoding according to the present embodiment comprises the following encoding steps. First, the step S151 is executed for judging if the color pixel is greater than the maximum pixel value or smaller than the minimum pixel value. When the color pixel is greater than the maximum pixel value, the step S152 is executed for subtracting the maximum pixel value from the color pixel plus 1 and giving a first difference. When the color pixel is smaller than the minimum pixel value, the step S153 is executed for subtracting the color value from the minimum pixel value plus 1 and giving a second difference. Then, the step S154 is executed for giving a quotient and a remainder by dividing the difference by the fixed encoding parameter. Afterwards, perform encoding according to the quotient and the remainder given in the step S154.

According to the present embodiment, the color pixel is greater than the maximum pixel value; the maximum pixel value is H=104; the color pixel is P=135; and the fixed encoding parameter is k=2. The calculations are listed as following:

$P-H-1=135-104-1=30$

Quotient: $30/2^2=7$, Encoded as: 111
Remainder: $30 \bmod 2^2=2$, Encoded as: 010
Because the encoding format of the Golomb-Rice encoding is quotient+'0'+remainder, the Golomb-Rice-encoded value of the color pixel P is 1110010.

According to the description above, the method for image processing according to the present invention can be applied to every color pixel of each frame. In addition, because there is no data dependency, the influence of data dependency during encoding process on the amount of data will not occur. The method for image processing according to the present invention can be further applied to decoding applications.

Figure 6:
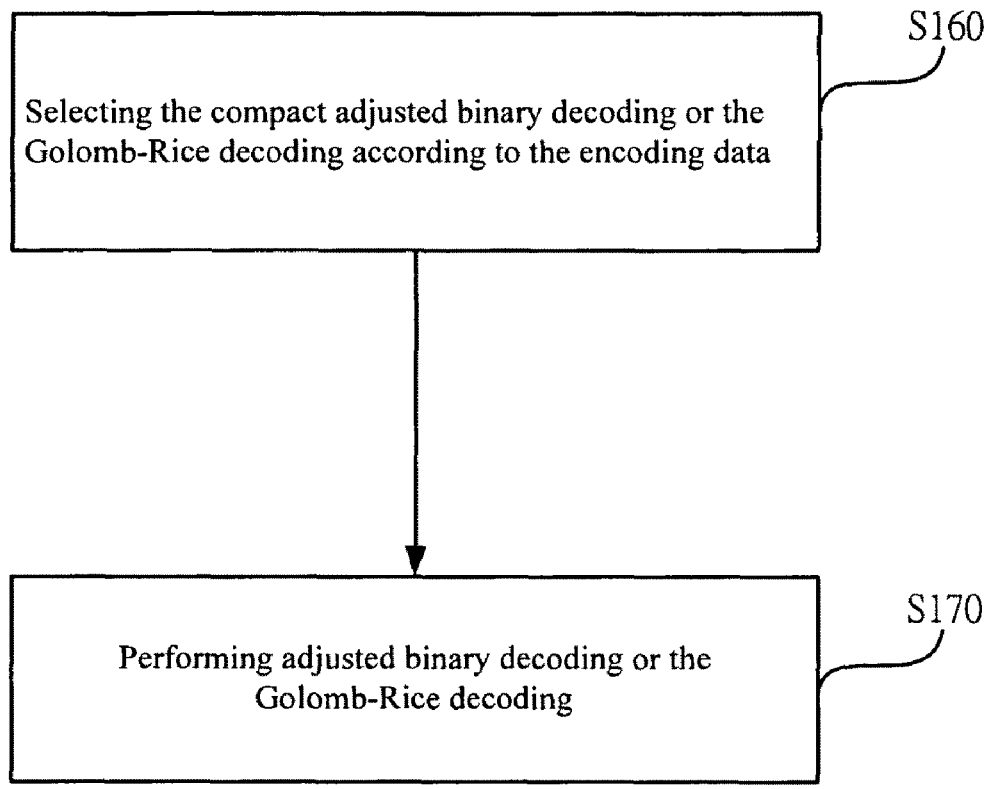
FIG. 6 shows a flowchart of image decoding according to an embodiment of the present invention.

FIG. 6 shows a flowchart of image decoding according to an embodiment of the present invention. As shown in the figure, the method for image processing according to the present invention can continue to execute the step S160 for selecting the compact adjusted binary decoding or the Golomb-Rice decoding according to the encoding data. Then, the step S170 is performing compact adjusted binary decoding or the Golomb-Rice decoding. In the step S160, because the encoding format is recorded in the encoding data, the encoding method can be judged without ambiguity. Namely, the compact adjusted binary decoding or the Golomb-Rice decoding can be selected directly for decoding in the step S170.

In addition to the procedure mentioned in previous paragraph, color difference operations can be used to reduce the amount of data for operating the color pixels in each frame, and hence the image processing performance can be improved.

Figure 7:
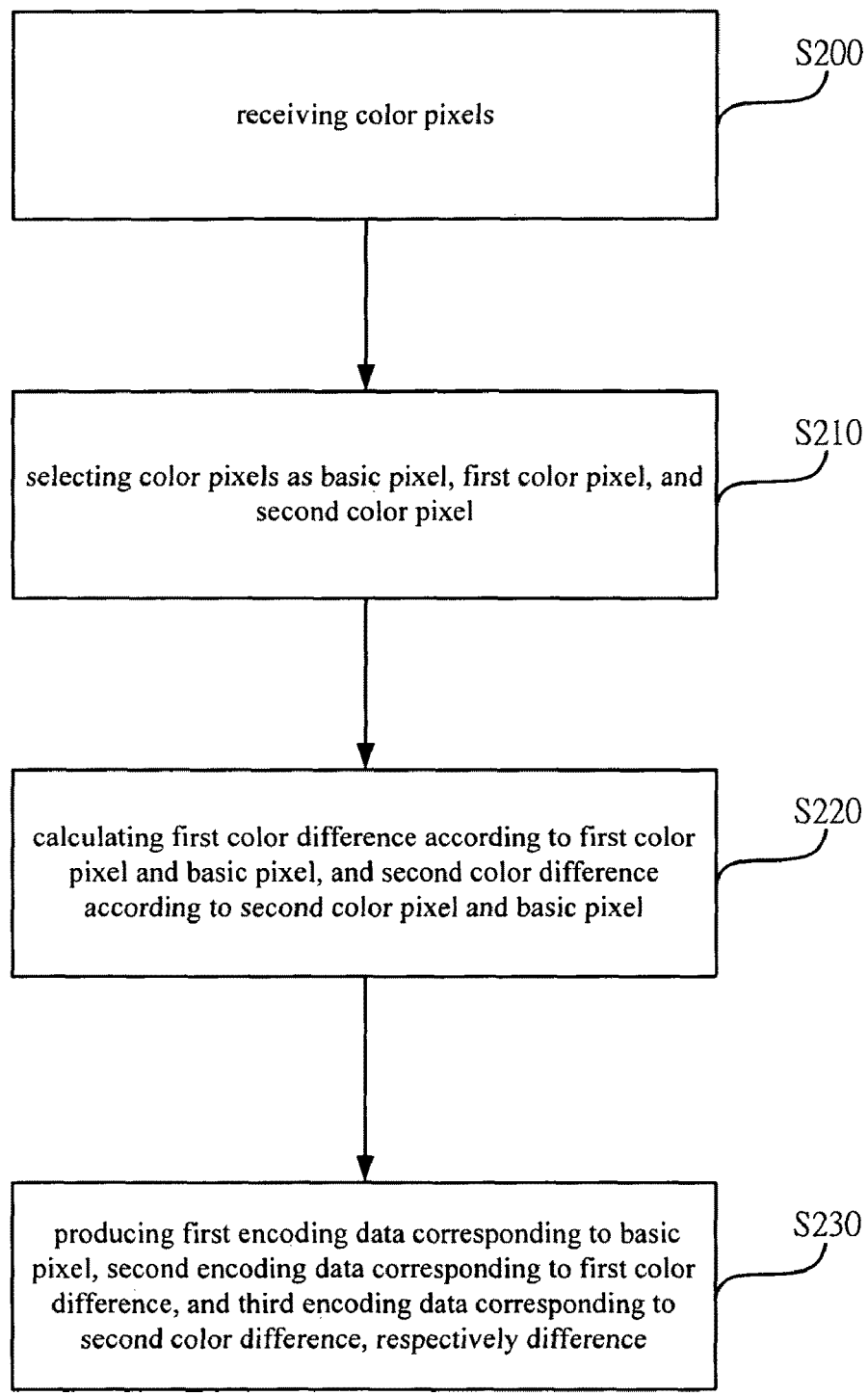
FIG. 7 shows a flowchart according to another embodiment of the present invention.

FIG. 7 shows a flowchart according to another embodiment of the present invention. As shown in the figure, the method for image processing according to the present invention can be further applied to color difference operations. The step S200 is first executed for receiving a plurality of color pixels. Then the step S210 is executed for selecting the color pixels as a basic pixel, a first color pixel, and a second color pixel. Next, the step S220 is executed for calculating a first color difference according to the first color pixel and the basic pixel, and a second color difference according to the second color pixel and the basic pixel. Afterwards, the step S230 is executed for selecting the corresponding one or more encoding methods according to the basic pixel, the first color difference, and the second color difference, performing encoding, and producing first encoding data corresponding to the basic pixel, second encoding data corresponding to the first color difference, and third encoding data corresponding to the second color difference, respectively.

Beside, a scalar is further added to the first and the second color differences, respectively, for avoiding negative values of the first and the second color differences, which will result in difficulties in operations. The preferable scalar according to the present embodiment is 256.

Figure 8:
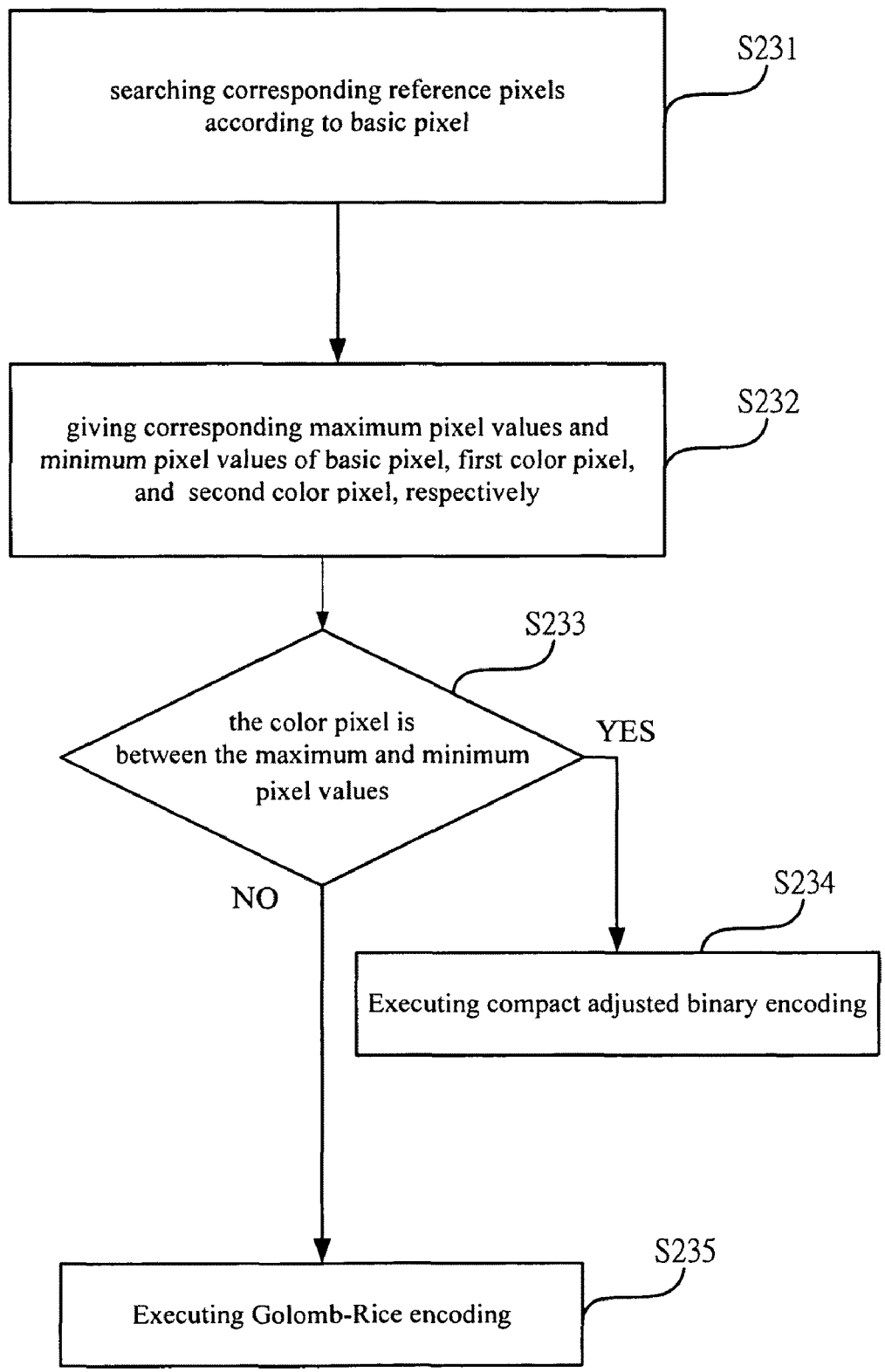
FIG. 8 shows a flowchart of image encoding according another embodiment of the present invention.

In the step S230, as shown in FIG. 8, the following steps are further included. First, the step S231 is executed for searching a plurality of corresponding reference pixels according to the basic pixel, the first color pixel, and the second color pixel. Then, the step S232 is executed for giving the corresponding maximum pixel values and the minimum pixel values of the basic pixel, the first color pixel, and the second color pixel, respectively, according to the reference pixels. Next, the step S233 is executed for selecting the corresponding compact adjusted binary encoding or the Golomb-Rice encoding, respectively, according to the corresponding maximum and minimum pixel values of the basic pixel, the corresponding maximum and minimum pixel values of the first color difference, and the corresponding maximum and minimum pixel values of the second color difference, and performing encoding. As shown in the step S234, the compact adjusted binary encoding is executed for producing the corresponding encoding data. As shown in the step S235, the Golomb-Rice encoding is executed for producing the corresponding encoding data.

The method for searching the reference pixels described in the step S231 is the same as the steps S111 to S115 described above. Thereby, the searching method for the reference pixels of the basic pixel, the first color pixel, and the second color pixel is as shown in FIG. 3A. When the basic pixel is the first or second pixel in the first row of a frame, the basic pixel has no reference pixel and will not be encoded. When the first color pixel is the first or second pixel in the first row of a frame, the first color pixel has no reference pixel and will not be encoded. When the second color pixel is the first or second pixel in the first row of a frame, the second color pixel has no reference pixel and will not be encoded. When the basic pixel is in the first row of a frame but not the first or second pixel, the corresponding reference pixels of the basic pixel are the previous two pixels to the basic pixel. When the first color pixel is in the first row of a frame but not the first or second pixel, the corresponding reference pixels of the first color pixel are the previous two pixels to the first color pixel. When the second color pixel is in the first row of a frame but not the first or second pixel, the corresponding reference pixels of the second color pixel are the previous two pixels to the second color pixel.

When the basic pixel is a pixel in the first row of a frame, the corresponding reference pixels of the basic pixel are the two pixels adjacent to the basic pixel in the previous row, or the pixel adjacent to the basic pixel in the previous row and the previous pixel to the basic pixel. When the first color pixel is a pixel in the first row of a frame, the corresponding reference pixels of the first color pixel are the two pixels adjacent to the first color pixel in the previous row, or the pixel adjacent to the first color pixel in the previous row and the previous pixel to the first color pixel. When the second color pixel is a pixel in the first row of a frame, the corresponding reference pixels of the second color pixel are the two pixels adjacent to the second color pixel in the previous row, or the pixel adjacent to the second color pixel in the previous row and the previous pixel to the second color pixel.

In the step S232, because the two reference pixels of the first and second color pixels correspond to the first and second color differences, respectively, the maximum and minimum pixel values corresponding to the basic pixel, the first color pixel, and the second color pixel are given by the two pixel values of the corresponding reference pixels of the basic pixel, the first color pixel, and the second color pixel, respectively. In the step S233, judge if the basic pixel, the first color pixel, and the second color pixel are between the corresponding maximum and minimum pixel values. When the basic pixel is between the maximum and minimum pixel values, the step S234 is executed for selecting the compact adjusted binary encoding; when the basic pixel is not between the maximum and minimum pixel values, the step S235 is executed for selecting the Golomb-Rice encoding. When the first color difference is between the maximum and minimum pixel values, the step S234 is executed for selecting the compact adjusted binary encoding; when the first color difference is not between the maximum and minimum pixel values, the step S235 is executed for selecting the Golomb-Rice encoding. When the second color difference is between the maximum and minimum pixel values, the step S234 is executed for selecting the compact adjusted binary encoding; when the second color difference is not between the maximum and minimum pixel values, the step S235 is executed for selecting the Golomb-Rice encoding. When encoding the basic pixel using the Golomb-Rice encoding, a fixed encoding parameter is used for encoding the basic pixel. When encoding the first color difference using the Golomb-Rice encoding, a fixed encoding parameter is used for encoding the first color difference. When encoding the second color difference using the Golomb-Rice encoding, a fixed encoding parameter is used for encoding the second color difference. The fixed encoding parameter is a divisor parameter with a preferable value of the square of 2, namely, 4.

Figure 9:
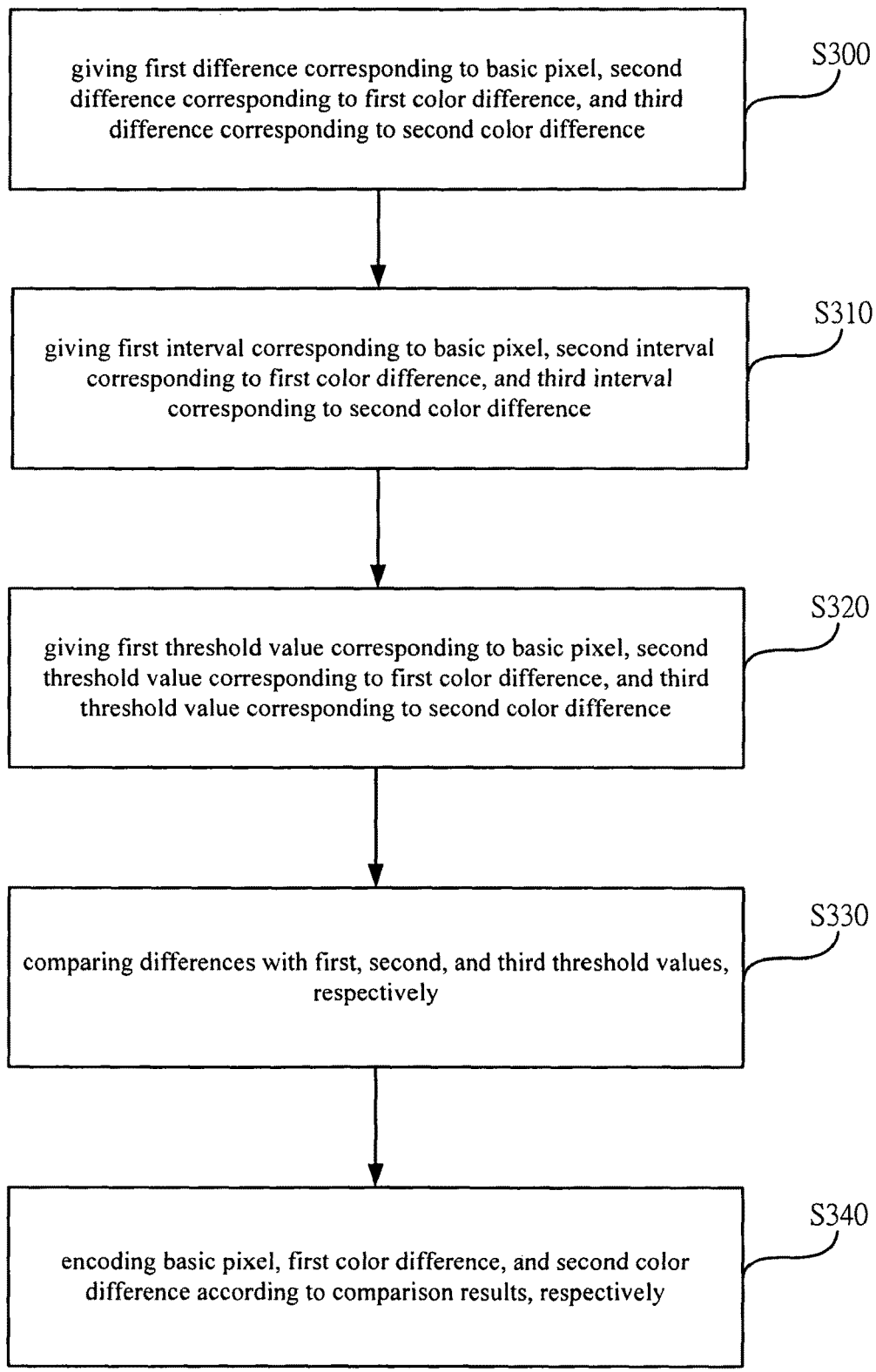
FIG. 9 shows a flowchart of the compact adjusted binary encoding according to another embodiment of the present invention.

FIG. 9 shows a flowchart of the compact adjusted binary encoding according to another embodiment of the present invention. As shown in the figure, in the compact adjusted binary encoding according to the present embodiment, the step S300 is first executed for subtracting the corresponding minimum pixel values from the basic pixel, the first color difference, and the second color difference, respectively, for giving a first difference corresponding to the basic pixel, a second difference corresponding to the first color difference, and a third difference corresponding to the second color difference. Then, the step S310 is executed for subtracting the minimum pixel values from the maximum pixel values corresponding to the basic pixel, the first color difference, and the second color difference and plus one, respectively, for giving a first interval corresponding to the basic pixel, a second interval corresponding to the first color difference, and a third interval corresponding to the second color difference. Next, the step S320 is executed for calculating the base 2 logarithm of the intervals, respectively, to give a first threshold value corresponding to the basic pixel, a second threshold value corresponding to the first color difference, and a third threshold value corresponding to the second color difference. Afterwards, the step S330 is executed for comparing the differences with the first, second, and third threshold values, respectively, for giving a first comparison result corresponding to the basic pixel, a second comparison result corresponding to the first color difference, and a third comparison result corresponding to the second color difference. Finally, the step S340 is executed for encoding the basic pixel, the first color difference, and the second color difference according to the comparison results, respectively, which is the same as the steps S144 to S146 described above.

Figure 10:
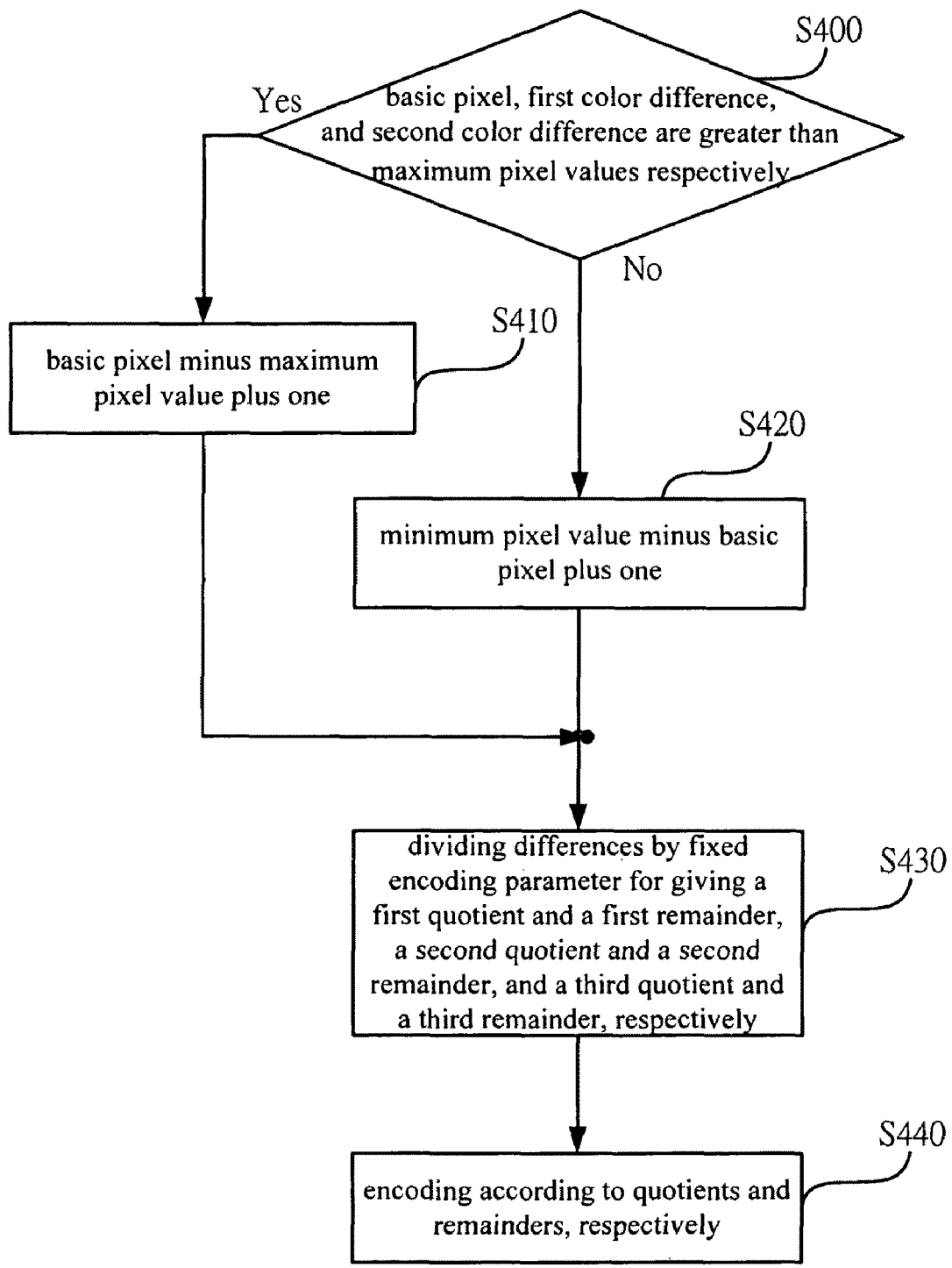
FIG. 10 shows a flowchart of the Golomb-Rice encoding according to another embodiment of the present invention.

FIG. 10 shows a flowchart of the Golomb-Rice encoding according to another embodiment of the present invention. As shown in the figure, in the Golomb-Rice encoding according to the present embodiment, the step S400 is first executed for judging, respectively, if the basic pixel, the first color difference, and the second color difference are greater than the maximum pixel values or smaller than the minimum pixel values. When the basic pixel is greater than the maximum pixel value, the step S410 is executed for giving the first difference corresponding to the basic pixel as the basic pixel minus the maximum pixel value plus one; when the basic pixel is smaller than the maximum pixel value, the step S420 is executed for giving the first difference corresponding to the basic pixel as the minimum pixel value minus the basic pixel plus one. When the first color difference is greater than the maximum pixel value, the step S410 is executed for giving the second difference corresponding to the first color difference as the first color difference minus the maximum pixel value plus one; when the first color difference is smaller than the maximum pixel value, the step S420 is executed for giving the second difference corresponding to the first color difference as the minimum pixel value minus the first color difference plus one. When the second color difference is greater than the maximum pixel value, the step S410 is executed for giving the third difference corresponding to the second color difference as the basic pixel minus the maximum pixel value plus one; when the second color difference pixel is smaller than the maximum pixel value, the step S420 is executed for giving the third difference corresponding to the second color difference as the minimum pixel value minus the second color difference plus one. Thereby, the first, the second, and the third differences are given. Then, the step S430 is executed for dividing the differences by the fixed encoding parameter for giving a first quotient and a first remainder corresponding to the basic pixel, a second quotient and a second remainder corresponding to the first color difference, and a third quotient and a third remainder corresponding to the second color difference, respectively. Next, the step S440 is executed for encoding according to the quotients and the remainders, respectively.

Figure 11:
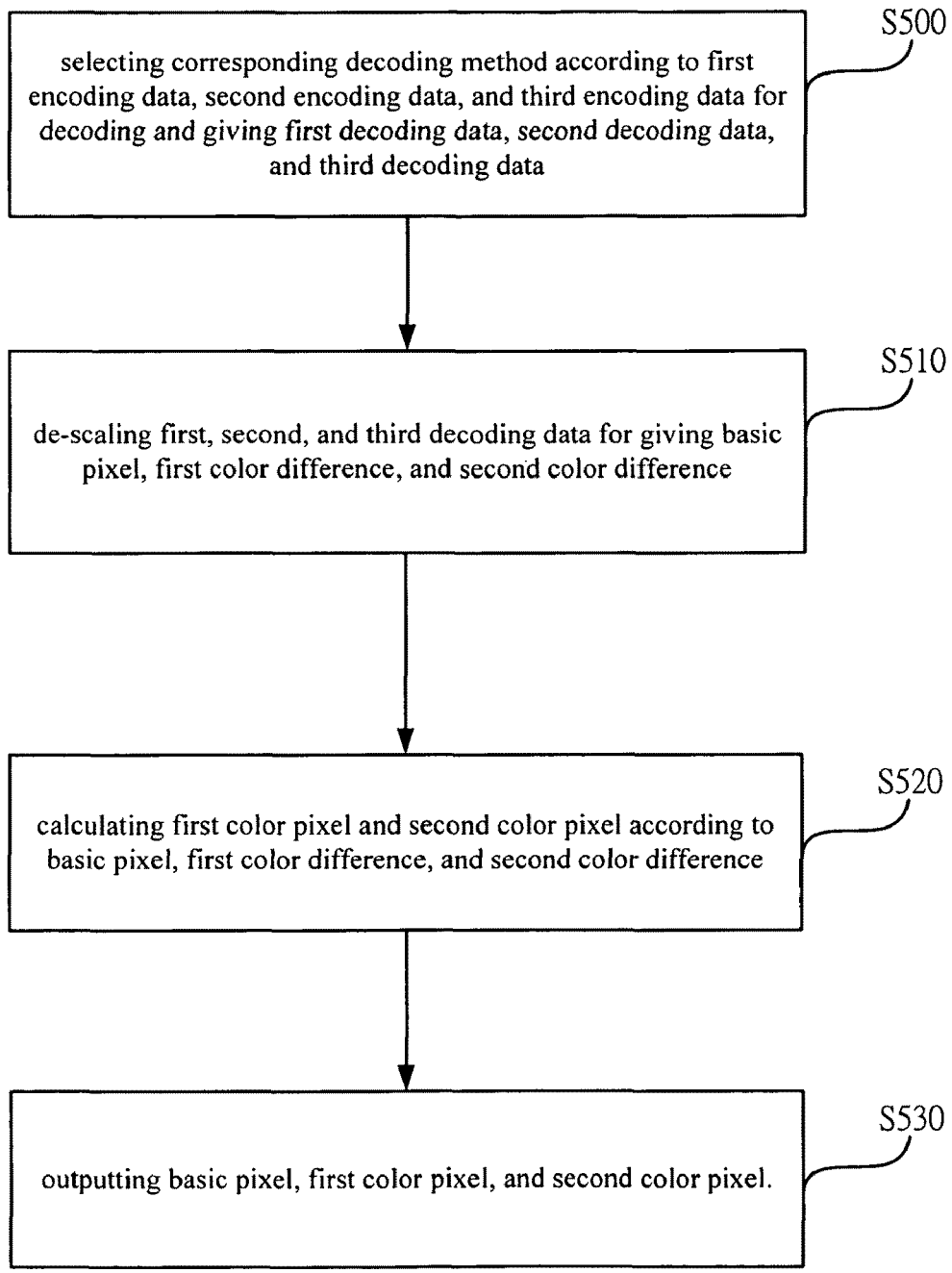
FIG. 11 shows a flowchart of image decoding according to another embodiment of the present invention.

FIG. 11 shows a flowchart of image decoding according to another embodiment of the present invention. As shown in the figure, in the method for image process according to the present embodiment, the step S500 can be further executed for selecting one or more corresponding decoding methods according to the first encoding data, the second encoding data, and the third encoding data for decoding and giving first decoding data, second decoding data, and third decoding data. Then, the step S510 is executed for de-scaling the basic pixel, the first color difference, and the second color difference. Next, the step S520 is executed for calculating the first color pixel and the second color pixel according to the basic pixel, the first color difference, and the second color difference. Finally, the step S530 is executed for outputting the basic pixel, the first color pixel, and the second color pixel. In the step S500, according to the present embodiment, the compact adjusted binary decoding or the Golomb-Rice decoding is selected according to the encoding format recorded in the encoding data for giving the first, second, and third decoding data.

Figure 12A:
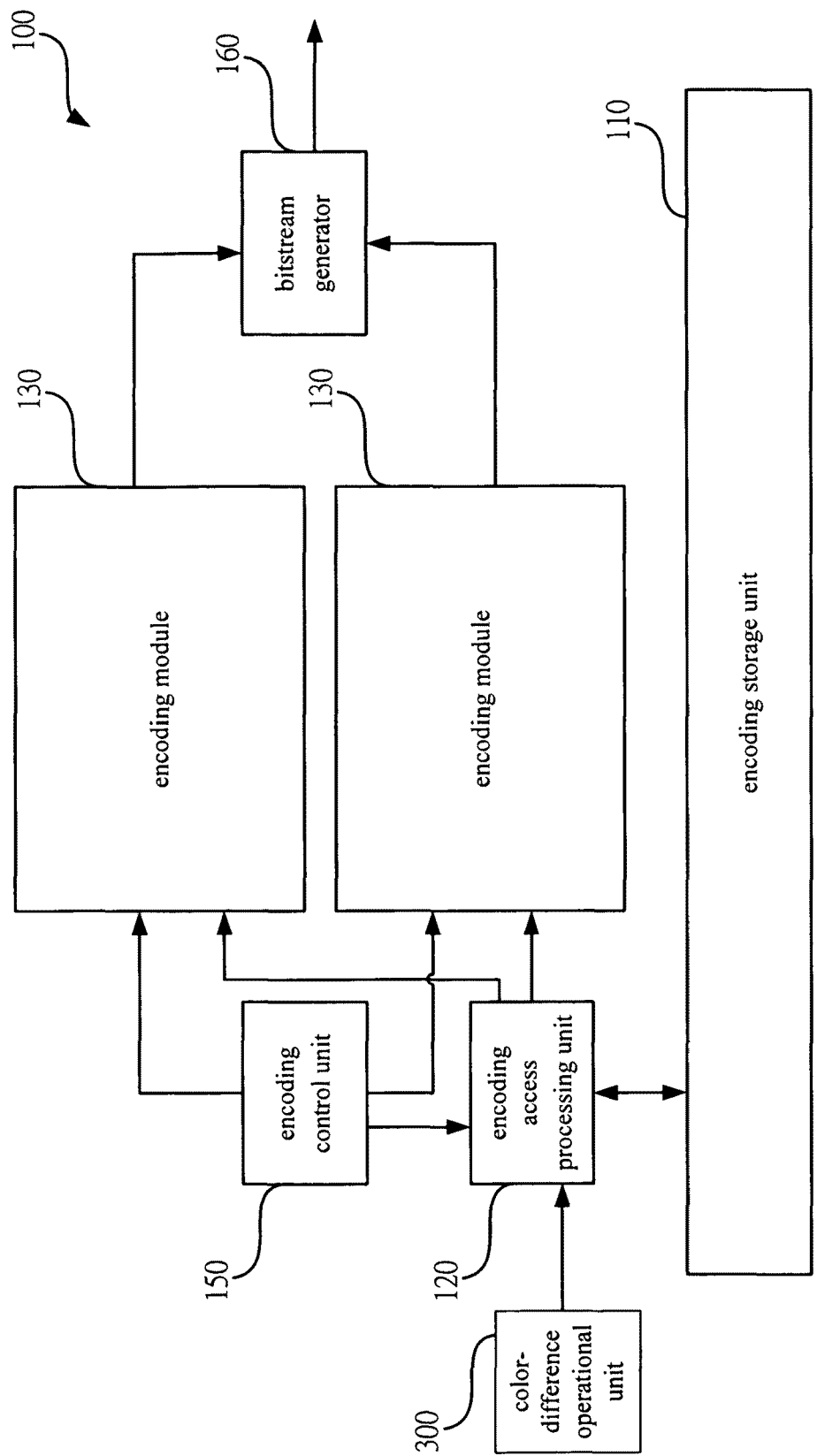
FIG. 12A shows a block diagram of an encoding circuit according to a preferred embodiment of the present invention.

FIG. 12A shows a block diagram of an encoding circuit according to a preferred embodiment of the present invention. As shown in the figure, the apparatus for image processing according to the present invention includes an encoding circuit 100, which comprise an encoding storage unit 110, an encoding access processing unit 120, and one or more encoding modules 130. According to the present preferred embodiment of the present invention, a plurality of encoding modules 130 is used for encoding. That is, the plurality of encoding modules 130 executes parallel encoding operations. The encoding access processing unit 120 is coupled to the encoding storage unit 110, which stores one or more color pixels. The encoding access processing unit 120 reads the color pixel stored in the encoding storage unit 110 and the two corresponding reference pixels and inputs to the encoding module 130. The encoding module 130 produces the maximum and minimum pixel values according to the two reference pixels. The encoding module 130 encodes according to the color pixel, the maximum pixel value, and the minimum pixel value, and outputs encoding data corresponding to the color pixel. The encoding module 130 selects an encoder corresponding to the color pixel according to the color pixel, the maximum pixel value, and the minimum pixel value and performs encoding. In addition, according to the present invention, a bitstream generator 160 is further included for generating bitstream data according to the encoding data.

Figure 12B:
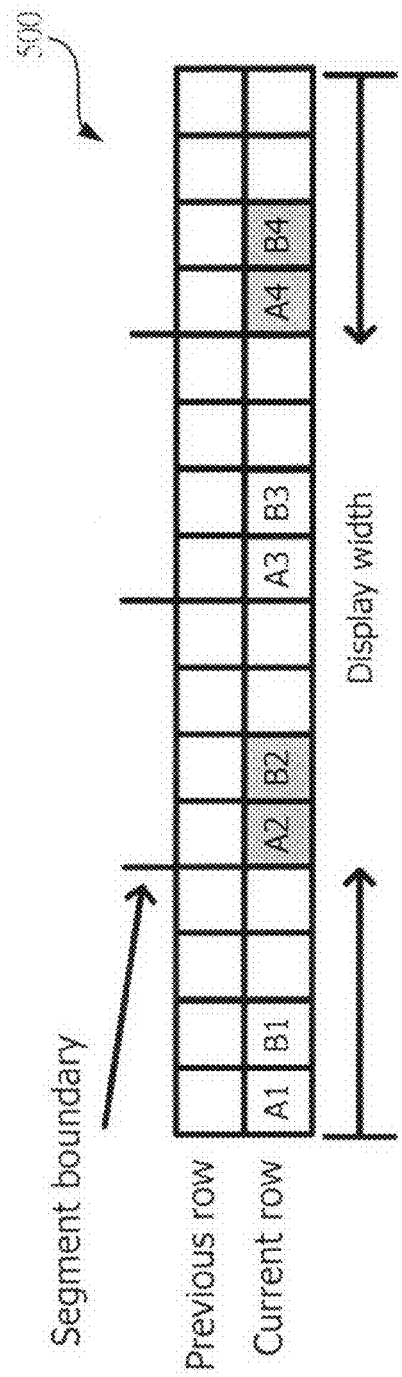
FIG. 12B shows a schematic diagram of encoding operations according to a preferred embodiment of the present invention.
Figure 12C:
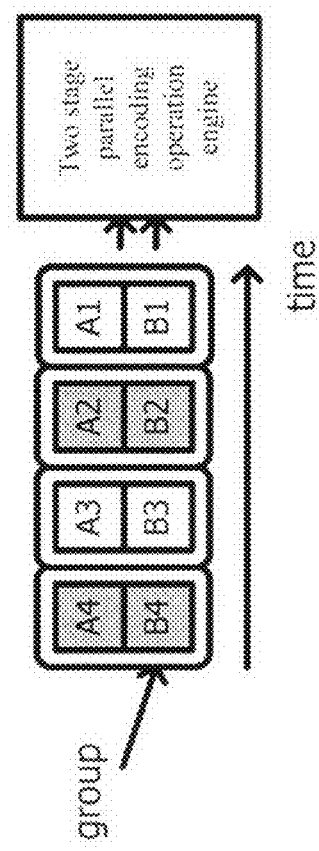
FIG. 12C shows a schematic diagram of encoding operations according to a preferred embodiment of the present invention.

As shown in FIG. 12B, during the encoding process of the apparatus for image processing according to the present embodiment, the display width of a frame 500 is divided into a plurality of segments with pixels A1, A2, A3, A4 and pixels B1, B2, B3, B4, respectively. The pixel A and pixel B in each segment, namely, the pixel A 1 and the pixel B1, the pixel A2 and the pixel B1, the pixel A3 and the pixel B3, and the pixel A4 and the pixel B4, are encoded using the operational processing architecture of parallel encoding operations as shown in FIG. 12C. Thereby, the apparatus for image processing according to the present invention can perform encoding using the operational architecture of pipeline operations as shown in FIG. 12D. The first-phase pipeline operation is accessing the color pixel; the second-phase pipeline operation is operating the parameter for encoding; the third-phase pipeline operation is encoding; the fourth-phase pipeline operation is producing the bitstream data.

Figure 13:
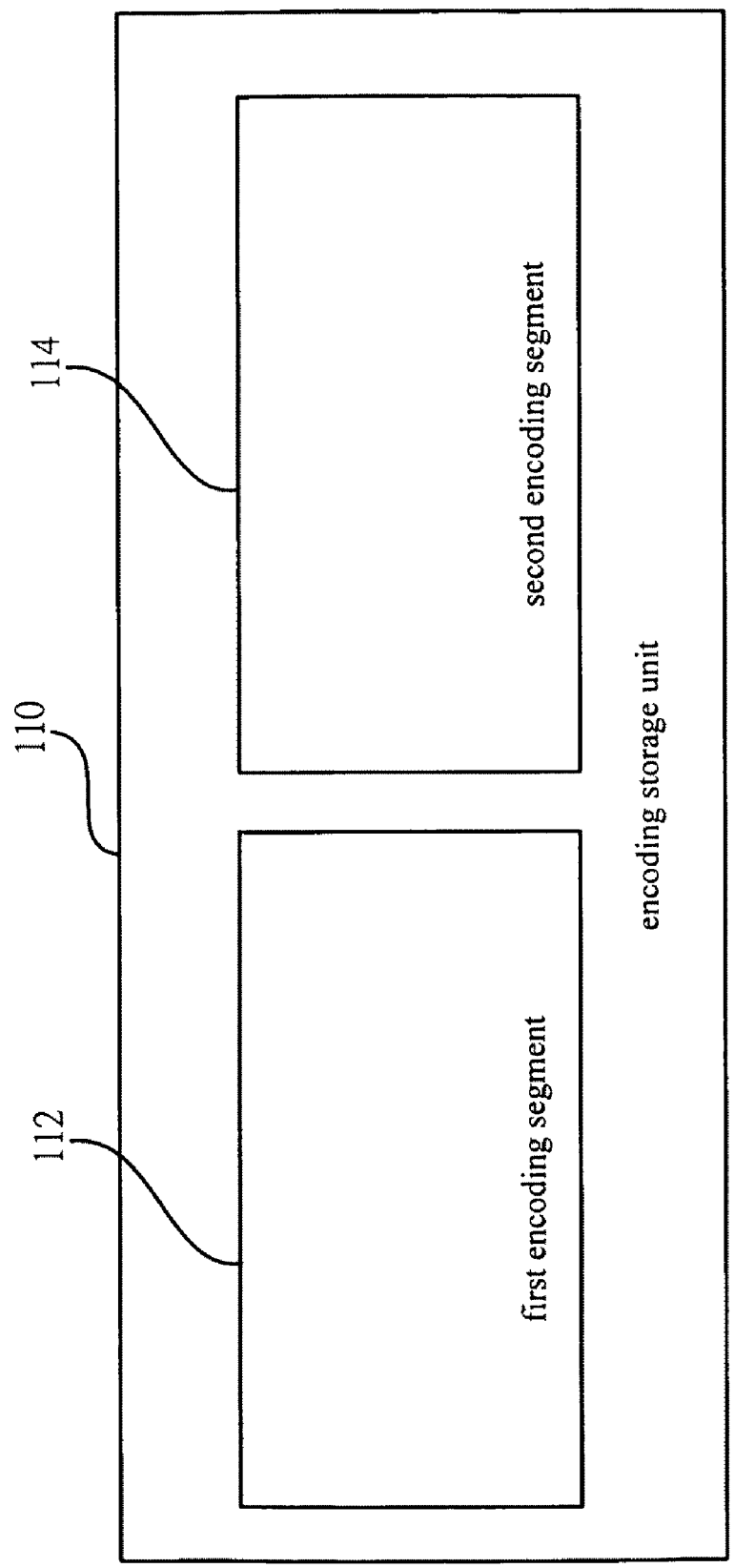
FIG. 13 shows a block diagram of an encoding storage unit according to a preferred embodiment of the present invention.
Figure 14:
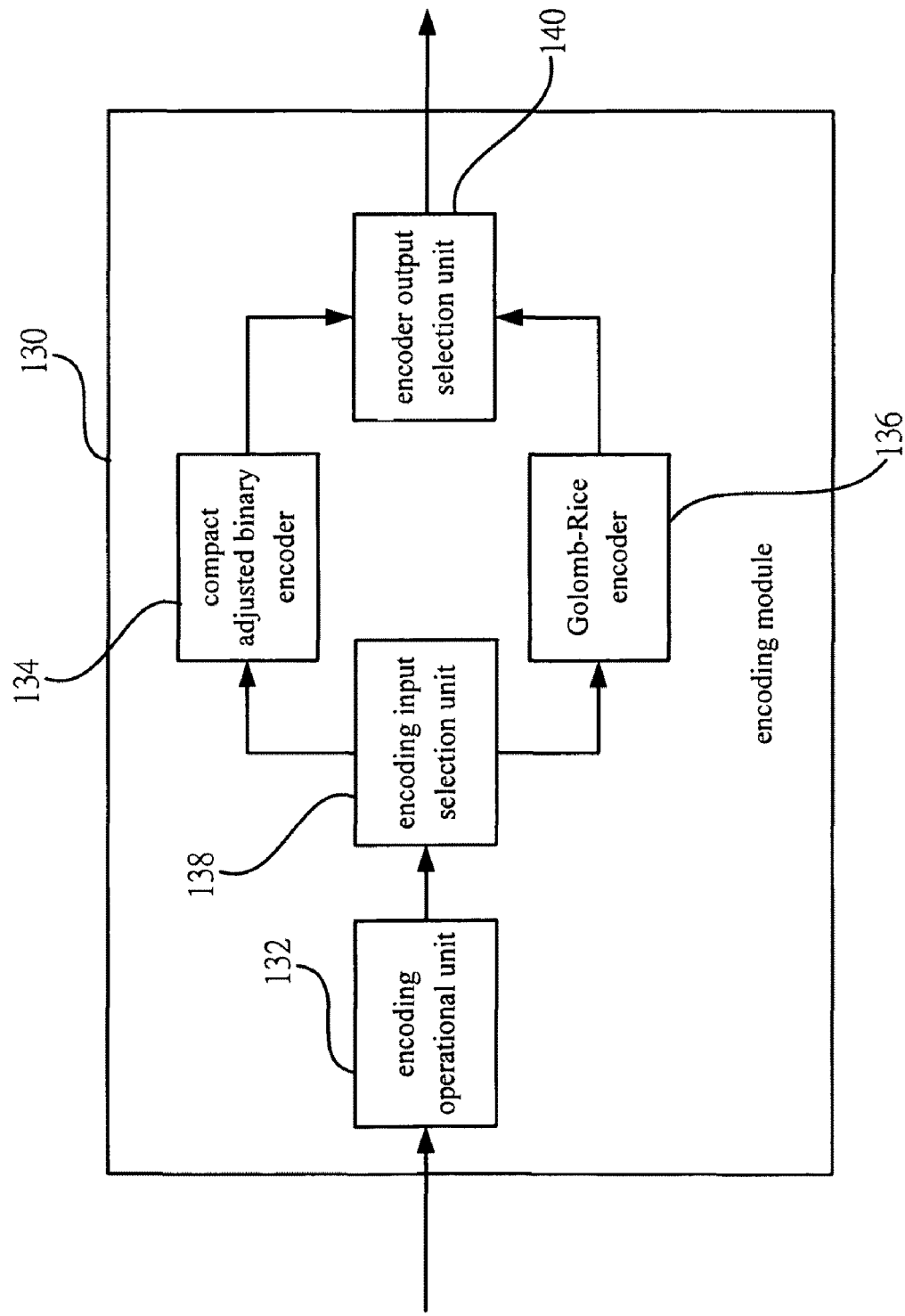
FIG. 14 shows a block diagram of an encoding module according to a preferred embodiment of the present invention.

As shown in FIG. 13, the encoding storage unit 110 comprises one or more encoding segments. The number of encoding segments corresponds to the number of the encoding modules. According to the present embodiment, the encoding circuit 100 comprises two encoding modules 130. Thereby, the encoding storage unit 110 according to the present embodiment comprises a first encoding segment 112 and a second encoding segment 114, which correspond to the plurality of encoding modules 130, respectively. As shown in FIG. 14, the plurality of encoding modules 130 includes an encoding operational unit 132, a compact adjusted binary encoder 134, and a Golomb-Rice encoder 136, respectively. Besides, the plurality of encoding modules further includes an encoding input selection unit 138 and an encoding output selection unit 140, respectively. The encoding input selection unit 138 is coupled to the encoding operational unit 132, the compact adjusted binary encoder 134, and the Golomb-Rice encoder 136; the encoder output selection unit 140 is coupled, to the compact adjusted binary encoder 134 and the Golomb-Rice encoder 136. The encoder access processing unit 120 reads the color pixel and the two corresponding reference pixels stored in the encoding storage unit 110, and inputs them to the encoding operational unit 132. The encoding operational unit 132 gives the maximum and minimum pixel values according to the two corresponding reference pixels of the color pixel. The compact adjusted binary encoder 134 is coupled to the encoding operational unit 132. The Golomb-Rice encoder 136 is coupled to the encoding operational unit 132. The compact adjusted binary encoder 134 and the Golomb-Rice encoder 136 produce first encoding data and second encoding data according to the color pixel, the maximum pixel value, and the minimum pixel value, respectively.

The compact adjusted binary encoder 134 subtracts the corresponding minimum pixel from the color pixel and gives a difference. The compact adjusted binary encoder 134 also subtracts the minimum pixel value from the maximum pixel value and plus one and gives an interval. Besides, the compact adjusted binary encoder 134 calculates the base 2 logarithm of the interval and gives a threshold value. Then, the compact adjusted binary encoder 134 compares the difference and the threshold value, and produces a comparison result. According to the comparison result, the compact adjusted binary encoder 134 encodes the color pixel. The Golomb-Rice encoder 136 judges if the color pixel is greater than the maximum pixel value or smaller than the minimum pixel value. When the color pixel is greater than the maximum pixel value, the maximum pixel value is subtracted from the color pixel and plus one; when the color value is smaller than the minimum pixel value, the color pixel is subtracted from the minimum pixel value and plus one for producing a difference correspondingly. According to the difference, the Golomb-Rice encoder 136 is divided by the fixed encoding parameter and a quotient and a remainder is given. According to the quotient and the remainder, the Golomb-Rice encoder 136 performs encoding. According to the present embodiment, an encoding control unit 150 is further included. According to the color pixel, the maximum pixel value, and the minimum pixel value, the encoding control unit 150 controls the encoding input selection unit 138 to select inputting the color pixel, the maximum pixel value, and the minimum pixel value to the compact adjusted binary encoder 134 or to the Golomb-Rice encoder 136 for encoding the color pixel. The encoding module 130 produces the corresponding encoding data according to the encoding result of the color pixel.

Referring back to FIG. 12A, the encoding circuit 100 further comprises a bitstream generator 160, which is coupled to the encoding module 130, and produces bitstream data in accordance with the encoding data. Namely, the bitstream generator 160 is coupled to the encoding output selection unit 140 shown in FIG. 3 for receiving the encoding data produced by the compact adjusted binary encoder 134 or the Golomb-Rice encoder 136. The encoding circuit according to the present embodiment includes two encoding modules 130. Thereby, the bitstream generators 160 are coupled to the two encoding modules 130, respectively. In addition, the bitstream generator 160 produces the corresponding bitstream data according to the encoding data given by the two encoding modules 130.

Figure 15:
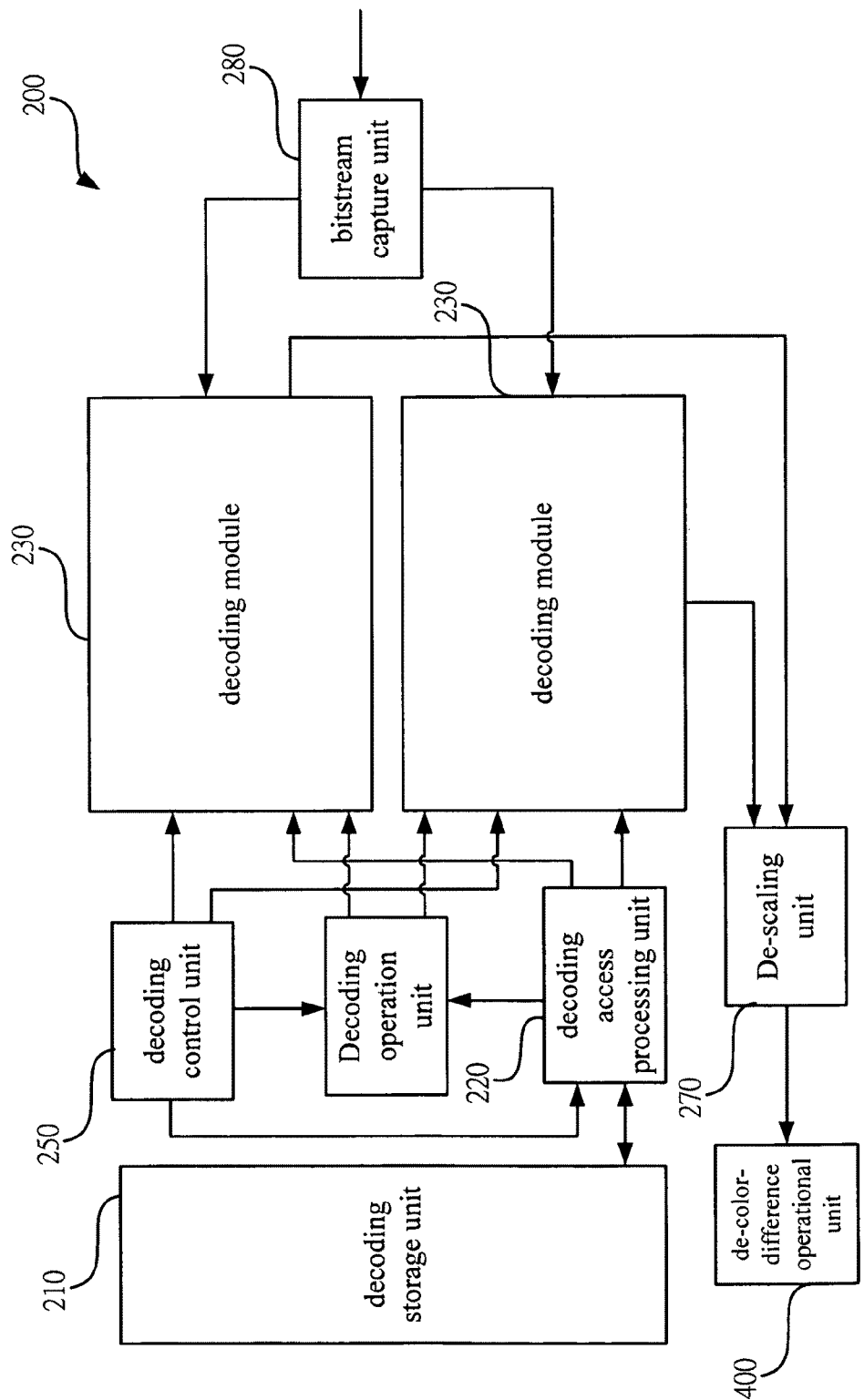
FIG. 15 shows a block diagram of a decoding circuit according to a preferred embodiment of the present invention.
Figure 16:
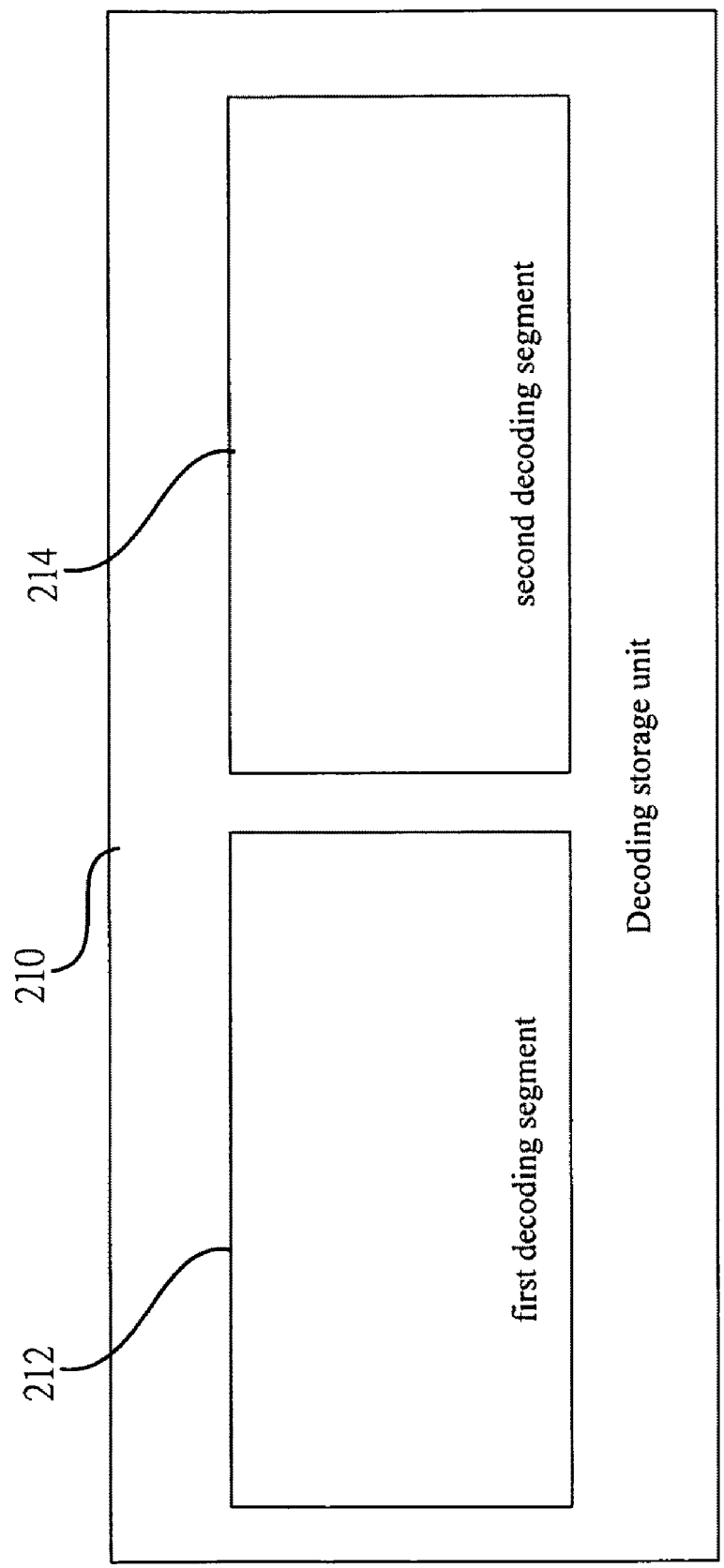
FIG. 16 shows a block diagram of a decoding storage unit according to a preferred embodiment of the present invention.
Figure 17:
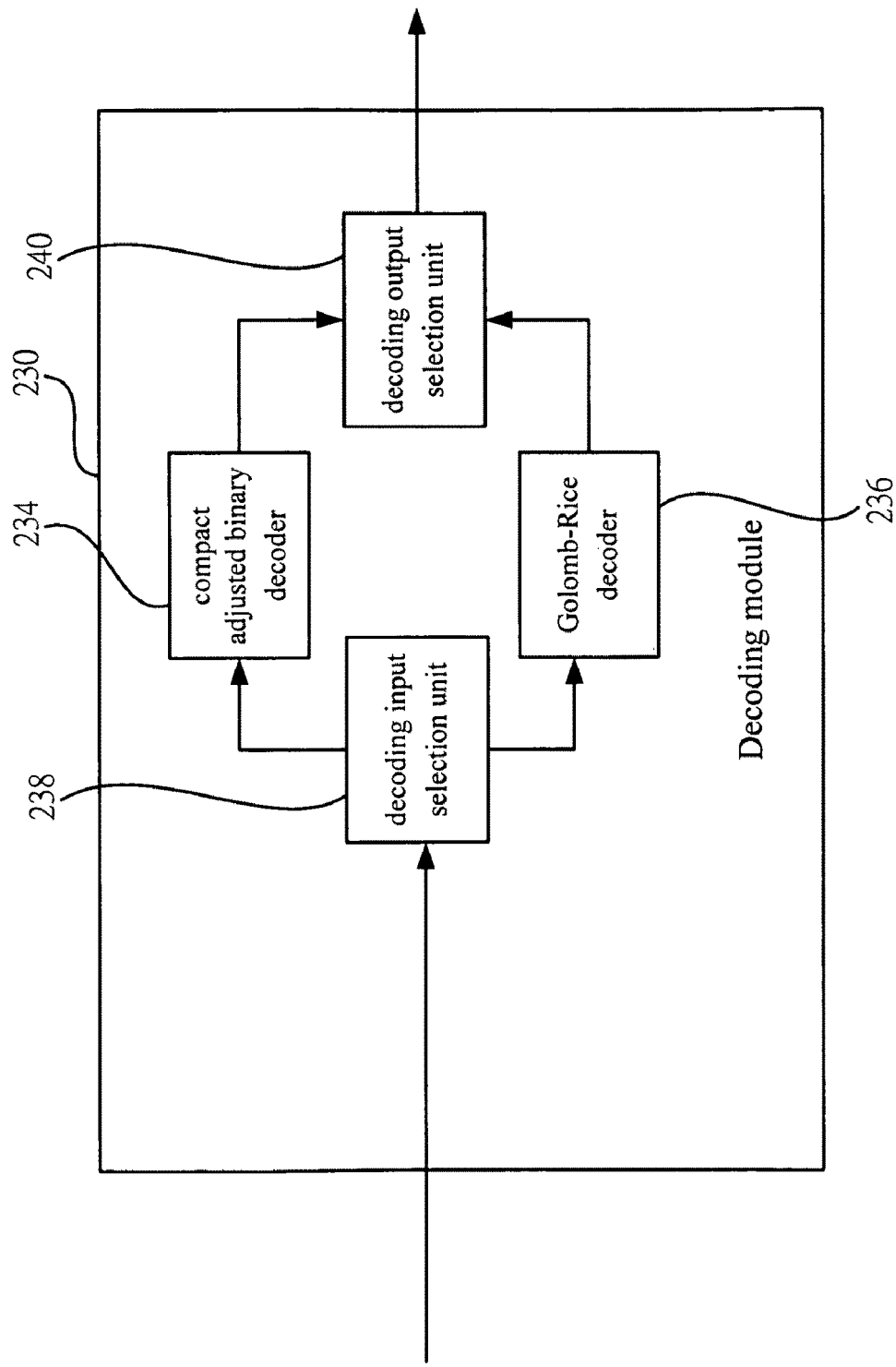
FIG. 17 shows a block diagram of a decoding module according to a preferred embodiment of the present invention.

FIG. 15 shows a block diagram of a decoding circuit according to a preferred embodiment of the present invention. As shown in the figure, the apparatus for image processing according to the present invention further includes a decoding circuit 200, which comprises a decoding storage unit 210, a decoding access processing unit, a decoding operational unit 232, and one or more decoding modules 230. According to the present preferred embodiment, the parallel decoding operation using a plurality of decoding modules 230 is used as an example. As shown in FIG. 16, the decoding storage unit 210 has a first decoding segment 212 and a second decoding segment 214 corresponding to the plurality of decoding modules 230, respectively. As shown in FIG. 17, the decoding module 230 has a compact adjusted binary decoder 234 and a Golomb-Rice decoder 236. Besides, the decoding module 230 further includes a decoding input selection unit 238 and a decoding output selection unit 240. The decoding module 230 receives the first encoding data and the second encoding data, and selects to input to the compact adjusted binary decoder 234 and the Golomb-Rice decoder 236 in accordance with the first and second encoding data for performing encoding. Thereby, the compact adjusted binary decoder 234 decodes according to the first encoding data and produces first decoding data; the Golomb-Rice decoder 236 decodes according to the second encoding data and produces second decoding data. The decoding storage unit 210 stores the first and second decoding data. The decoding access processing unit 220 receives the first or second decoding data and stores it to the decoding storage unit 210. The decoding operational unit 232 produces a first decoding parameter and a second decoding parameter in accordance with the first and second decoding data, and transmits the first and second decoding parameters to the compact adjusted binary decoder 234 and the Golomb-Rice decoder 236, respectively. Hence, the compact adjusted binary decoder 234 and the Golomb-Rice decoder 236 can decode the subsequent encoding data. Moreover, the decoding circuit 200 according to the present preferred embodiment further comprises a de-scaling unit 270, which de-scales the first or second decoding data for producing the corresponding color pixel.

In addition, a decoding control unit 250 is further included. The decoding control unit 250 is coupled to the decoding module 230, the decoding access processing module 220, and the decoding operational unit 232. The decoding control unit 250 controls the decoding access processing unit 220 to access the decoding data. The decoding control unit 250 controls the decoding operational unit 232 to read the color pixel stored in the decoding storage unit 210 via the decoding access processing unit 220 and calculates a decoding parameter. When the decoding module 230 receives the decoding parameter, the decoding module 230 performs decoding in accordance with the decoding parameter and the next encoding data.

When the encoding access processing unit 220 is reading the two reference pixels, if the color pixel is the first or second pixel in the first row of a frame, the encoding access processing unit 220 will not be able to read the two reference pixels, and the compact adjusted binary decoder 234 and the Golomb-Rice decoder 236 will not encode the color pixel; if the color pixel is in the first row of a frame but not the first or second pixel, the two reference pixels read by the encoding access processing unit 220 are the previous two pixels to the color pixel; if the color pixel is not a pixel in the first row of a frame, the two reference pixels read by the encoding access processing unit 220 are the two pixels adjacent to the color pixel in the previous row; if the color pixel is not a pixel in the first row of a frame, the two reference pixels read by the encoding access processing unit 220 are the pixel adjacent to the color pixel in the previous row and the previous pixel to the color pixel.

Figure 18A:
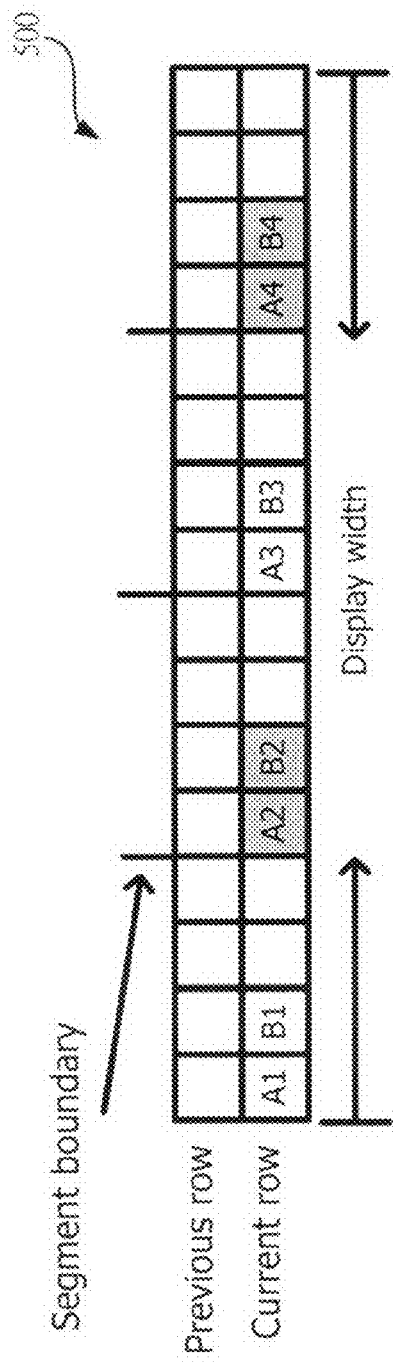
FIG. 18A shows a schematic diagram of decoding operations according to a preferred embodiment of the present invention.
Figure 18B:
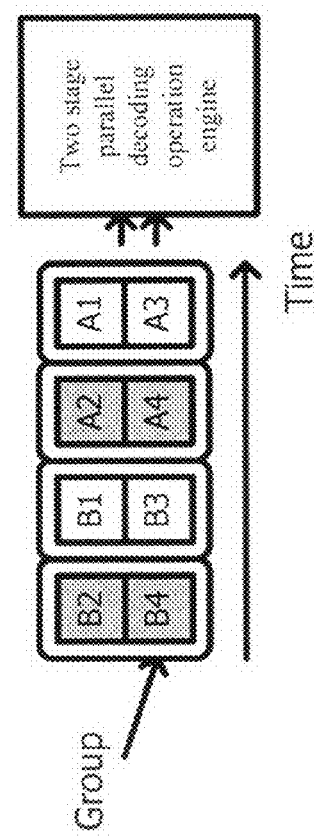
FIG. 18B shows a schematic diagram of decoding operations according to a preferred embodiment of the present invention.

As shown in FIG. 18A, during the decoding process of the apparatus for image processing according to the present preferred embodiment, the display width of a frame 500 is divided into a plurality of segments with pixels A1, A2, A3, A4 and pixels B1, B2, B3, B4, respectively. The pixel A and pixel B in each segment, namely, the pixel A1 and the pixel A3, the pixel B1 and the pixel B3, the pixel A2 and the pixel A4, and the pixel B2 and the pixel B4, are encoded using the operational processing architecture of parallel encoding operations as shown in FIG. 18B. Thereby, the apparatus for image processing according to the present invention can perform encoding using the operational architecture of pipeline operations as shown in FIG. 18C. The first-phase pipeline operation is producing encoding data according to the bitstream data; the second-phase pipeline operation is decoding; the third-phase pipeline operation is calculating and storing in the decoding storage unit 210 for decoding the subsequent decoding data.

Moreover, the apparatus for image processing according to the present invention can further comprises a color-difference operational unit 300, which receives a plurality of color pixels and selects the color pixels as a basic pixel, a first color pixel, and a second color pixel. The color-difference operational unit 300 calculates a first color difference according to the basic pixel and first color pixel, and a second color difference according to the basic pixel and the second color pixel. Afterwards, the color-difference operational unit 300 outputs the basic pixel, the first color difference, and the second color difference to the encoding access processing unit 120 and store in the encoding storage unit 110. The encoding operational unit 132 selects the corresponding compact adjusted binary encoder 134 or Golomb-Rice encoder 136 according to the basic pixel and the corresponding maximum and minimum pixel values, the first color difference and the corresponding maximum and minimum pixel values, and the second color difference and the corresponding maximum and minimum pixel values, respectively, performs encoding, and produces first encoding data corresponding to the basic pixel, second encoding data corresponding to the first color difference, and third encoding data corresponding to the second color difference, respectively. Besides, the decoding circuit 200 further includes a corresponding de-color-difference operational unit 500. The first decoding data, the second decoding data, and the third decoding data are converted to the basic pixel, the first color difference, and the second color difference by the de-scaling unit 270. Then the de-color-difference operational unit 500 further converts the basic pixel, the first color difference, and the second color difference to the basic pixel, the first color pixel, and the second color pixel.

As shown in Table 1 below, the apparatus for image processing according to the present invention adopts TSMC's 0.18 µm technology. Because when the Golomb-Rice encoder according to the present invention encodes the color pixel, a fixed encoding parameter is used, the computation complexity according to the present invention is low. Thereby, the apparatus for image processing according to the present invention can use less gate devices for implementing the apparatus for image processing.

TABLE 1

|  |  | JPEG-LS | JPEG-LS | JPEG-LS | Present Invention |
|---|---|---|---|---|---|
| Year |  | 2004 | 2005 | 2007 | 2008 |
| Technology |  | ST 0.18 µm | 0.18 µm | UMC 0.18 µm | TSMC 0.18 µm |
| Operating Frequency (MHz) |  | N/A | 30 | 40 | 200 |
| Transmission Rate (MByte/sec) |  | N/A | 13.82 | 9.9 | 400 |
| Number of Encoding Cores |  | 2 | 1 | 1 | 2 |
| Gate Count | Logic Gate | 76.66k | 26k | 17.6k | 11.57k |
|  | Memory |  | 1.28k | 2.25k | 1.9k |

Consequently, the apparatus and method for image processing select the compact adjusted binary encoding and the Golomb-Rice encoding, and encode the corresponding color pixel. The Golomb-Rice encoding adopts a fixed encoding parameter for reducing the operational complexity. In addition, according to the present invention, the calculation of color differences can be used for reducing effectively the amount of data for operating.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit are described in the appended claims of the present invention.

The invention claimed is:

1. An apparatus for image processing, comprising:
an encoding storage unit, storing one or more color pixels;
an encoding access processing unit, coupled to the encoding storage unit, storing the color pixel to the encoding storage unit;
an encoding operational unit, coupled to the encoding access processing unit, the encoding access processing unit reading the color pixel stored in the encoding storage unit and two corresponding reference pixels and inputting to the encoding operational unit, and the encoding operational unit giving a maximum pixel value and a minimum pixel value according to the two reference pixels;
a compact adjusted binary encoder, coupled to the encoding operational unit, and producing first encoding data according to the color pixel, the maximum pixel value, and the minimum pixel value; and
a Golomb-Rice encoder, coupled to the encoding operational unit, producing second encoding data according to the color pixel, the maximum pixel value, the minimum pixel value, and a fixed encoding parameter;
wherein the encoding operational unit selects inputting the color pixel, the maximum pixel value, the minimum pixel value, and an encoding parameter to the compact adjusted binary encoder or the Golomb-Rice encoder according to the color pixel, the maximum pixel value, and the minimum pixel value.

2. The apparatus for image processing of claim 1, wherein the fixed encoding parameter is a divisor parameter.

3. The apparatus for image processing of claim 2, wherein the preferable value of the divisor parameter is 4.

4. The apparatus for image processing of claim 1, wherein the maximum pixel value and the minimum pixel value are the pixel values of the two reference pixels, respectively.

5. The apparatus for image processing of claim 1, and further comprising:
a compact adjusted binary decoder, receiving the first encoding data, performing encoding according to the first encoding data, and producing first decoding data;
a Golomb-Rice decoder, receiving the second encoding data, performing encoding according to the second encoding data, and producing second decoding data;
a decoding storage unit, storing the first decoding data or the second decoding data;
a decoding access processing unit, coupled to the compact adjusted binary decoder and the Golomb-Rice decoder, receiving the first decoding data or the second decoding data, and storing the first decoding data or the second decoding data to the decoding storage unit;
a decoding operational unit, producing a first decoding parameter and a second decoding parameter according the first decoding data and the second decoding data, and transmitting the first decoding parameter and the second decoding parameter to the compact adjusted binary decoder and the Golomb-Rice decoder, respectively, for decoding the subsequent encoding data by the compact adjusted binary decoder and the Golomb-Rice decoder; and
a de-scaling unit, performing de-scaling operations according to the first decoding data or the second decoding data, and producing the corresponding color pixel.

6. The apparatus for image processing of claim 1, wherein when the encoding access processing unit reads the two reference pixels, if the color pixel is the first pixel or the second pixel in the first row of a frame, then the encoding access processing unit cannot read the two reference pixels and the compact adjusted binary encoder or the Golomb-Rice encoder will not encode the color pixel.

7. The apparatus for image processing of claim 1, wherein when the encoding access processing unit reads the two reference pixels, if the color pixel is in the first row of a frame but not the first pixel or the second pixel in the first row, the two reference pixels read by the encoding access process unit are the previous two pixels of the color pixel.

8. The apparatus for image processing of claim 1, wherein when the encoding access processing unit reads the two reference pixels, if the color pixel is not a pixel in the first row of a frame, the two reference pixels read by the encoding access process unit are the two pixels adjacent to the color pixel in the previous row.

9. The apparatus for image processing of claim 1, wherein when the encoding access processing unit reads the two reference pixels, if the color pixel is not a pixel in the first row of a frame, the two reference pixels read by the encoding access process unit are the pixel adjacent to the color pixel in the previous row and the previous pixel to the color pixel.

10. The apparatus for image processing of claim 1, wherein the compact adjusted binary encoder subtracts the corresponding minimum pixel value from the color pixel and produces a difference; the compact adjusted binary encoder subtracts the minimum pixel value from the maximum pixel value and plus one, and gives an interval; the compact adjusted binary encoder calculates the base 2 logarithm of the interval, and gives a threshold value; the compact adjusted binary encoder compares the difference and the threshold value, and produces a comparison result; and the compact adjusted binary encoder encodes the color pixel according to the comparison result.

11. The apparatus for image processing of claim 1, wherein the Golomb-Rice encoder judges if the color pixel greater than the maximum pixel value or smaller than the minimum pixel value; if the color pixel is greater than the maximum pixel value, subtract the maximum pixel value from the color pixel and plus one; if the color pixel is smaller than the minimum pixel value, subtract the color pixel from the minimum pixel value and plus one for giving a difference; the Golomb-Rice encoder divides the difference by the fixed encoding parameter and gives a quotient and a remainder; and the Golomb-Rice encoder performs encoding according to the quotient and the remainder.

12. The apparatus for image processing of claim 1, and further comprising a color-difference operational unit, receiving a plurality of color pixels, selecting the plurality of color pixels as a basic pixel, a first color pixel, and a second color pixel, calculating a first color difference according to the first color pixel and the basic pixel, calculating a second color difference according to the second color pixel and the basic pixel, outputting the basic pixel, the first color difference, and the second color difference to the encoding access processing unit and storing in the encoding storage unit, the encoding operational unit selecting the corresponding compact adjusted binary encoder or Golomb-Rice encoder according to the basic pixel and the corresponding maximum and minimum pixel values, the first color difference and the corresponding maximum and minimum pixel values, and the second color difference and the corresponding maximum and minimum pixel values, respectively, and the encoding operational unit performing encoding and producing first encoding data corresponding to the basic pixel, second encoding data corresponding to the first color difference, and third encoding data corresponding to the second color difference, respectively.

* * * * *